United States Patent
Bianchini et al.

(10) Patent No.: US 10,655,843 B2
(45) Date of Patent: May 19, 2020

(54) SMART CANDLE PLATFORM AND SYSTEM

(71) Applicant: LuDela, Inc., Minden, NV (US)

(72) Inventors: Jamie Bianchini, Minden, NV (US); Eric David Bauswell, Eldridge, IA (US); Danny Ray Wafler, San Jose, CA (US)

(73) Assignee: LUDELA TECHNOLOGIES INC., Brea, CA (US)

( * ) Notice: Subject to any disclaimer, the term of this patent is extended or adjusted under 35 U.S.C. 154(b) by 194 days.

(21) Appl. No.: 15/799,249

(22) Filed: Oct. 31, 2017

(65) Prior Publication Data

US 2018/0066840 A1 Mar. 8, 2018

Related U.S. Application Data

(63) Continuation of application No. 15/452,704, filed on Mar. 7, 2017, now Pat. No. 9,810,426.

(Continued)

(51) Int. Cl.
*F23D 3/02* (2006.01)
*F23D 3/16* (2006.01)
(Continued)

(52) U.S. Cl.
CPC ............ *F23D 3/02* (2013.01); *F21V 35/003* (2013.01); *F23D 3/16* (2013.01); *F23D 3/26* (2013.01);
(Continued)

(58) Field of Classification Search
CPC ......... H01L 35/32; F23N 5/265; F23N 1/005; H04L 12/40091; H04L 12/282;
(Continued)

(56) References Cited

U.S. PATENT DOCUMENTS

| 343,461 A | 6/1886 | Kuntz |
| 3,091,106 A | 5/1963 | Brockway |

(Continued)

FOREIGN PATENT DOCUMENTS

| WO | 9015285 A1 | 12/1990 |
| WO | 1990015285 A1 | 12/1990 |

(Continued)

OTHER PUBLICATIONS

ISA/RU, International Search Report and Opinion, dated Jul. 6, 2017, PCT/US2017/021222.

(Continued)

*Primary Examiner* — Alfred Basichas
(74) *Attorney, Agent, or Firm* — Perkins Coie LLP

(57) ABSTRACT

A Smart Candle Platform may be configured to produce candle light using a natural wax candle as its fuel source or any other fuel source capable of producing light, including liquid fuels if so configured. The outer shell, inner cover, top cover and base provides a beautiful exterior shell which does not melt but emulates the look of a traditional pillar candle. The outer shell may be changeable/replaceable allowing for style and or seasonal changes. A Smart Candle Platform having multiple interactive systems and sensors for production of natural light via a safe, controllable device which may communicate with other similar configured devices or smart devices having application software embedded therein i.e. a smart phone having an app. is disclosed. The Smart Candle Platform may be configured to allow for auto-extinguishment. The Smart Candle Platform may be configured to allow for the addition of smells or scents.

20 Claims, 19 Drawing Sheets

Related U.S. Application Data

(60) Provisional application No. 62/396,769, filed on Sep. 19, 2016, provisional application No. 62/304,628, filed on Mar. 7, 2016.

(51) Int. Cl.
| | |
|---|---|
| *H04L 12/40* | (2006.01) |
| *F23N 5/26* | (2006.01) |
| *F21V 35/00* | (2006.01) |
| *F23D 3/26* | (2006.01) |
| *F23N 1/00* | (2006.01) |
| *F23Q 3/00* | (2006.01) |
| *F23Q 23/10* | (2006.01) |
| *H04L 12/28* | (2006.01) |
| *H01L 35/32* | (2006.01) |

(52) U.S. Cl.
CPC ............ *F23N 1/005* (2013.01); *F23N 5/265* (2013.01); *F23Q 3/00* (2013.01); *F23Q 23/10* (2013.01); *H04L 12/282* (2013.01); *H04L 12/40091* (2013.01); *F23D 2200/00* (2013.01); *H01L 35/32* (2013.01); *H04L 2012/2841* (2013.01)

(58) Field of Classification Search
CPC ... H04L 2012/2841; F23Q 23/10; F23Q 3/00; F23D 2200/00; F23D 3/16; F23D 3/02; F23D 3/26
See application file for complete search history.

(56) References Cited

U.S. PATENT DOCUMENTS

| | | | |
|---|---|---|---|
| 3,867,625 | A | 2/1975 | Whalen |
| 4,186,430 | A | 1/1980 | Britton |
| 4,260,365 | A | 4/1981 | Kayne |
| 4,566,055 | A | 1/1986 | Klees et al. |
| 4,755,135 | A | 7/1988 | Kwok |
| 5,057,005 | A | 10/1991 | Kwok |
| 5,424,928 | A | 6/1995 | Jordan et al. |
| 5,688,040 | A | 11/1997 | Klees |
| 5,722,763 | A | 3/1998 | Chen |
| 6,030,093 | A | 2/2000 | Draper |
| 6,328,935 | B1 | 12/2001 | Buccellato |
| 6,733,279 | B2 | 5/2004 | Thigpen et al. |

FOREIGN PATENT DOCUMENTS

| | | |
|---|---|---|
| WO | 2008061293 A1 | 5/2008 |
| WO | 2017156045 A1 | 9/2017 |

OTHER PUBLICATIONS

PCT International Search Report & Written Opinion, PCT/US2019/023477/ dated Mar. 21, 2019.

SMART CANDLE PLATFORM AND SYSTEM

CROSS REFERENCE TO RELATED APPLICATIONS

The present application is a continuation of U.S. patent application Ser. No. 15/452,704 filed Mar. 7, 2017 which claimed priority from utility provisional U.S. Pat. App. No. 62/304,628 filed on Mar. 7, 2016 and utility provisional U.S. Pat. App. No. 62/396,769 filed on Sep. 19, 2016, all of which are incorporated by reference herein in their entireties.

STATEMENT REGARDING FEDERALLY SPONSORED RESEARCH OR DEVELOPMENT

No federal funds were used to develop or create the invention disclosed and described in the patent application.

REFERENCE TO SEQUENCE LISTING, A TABLE, OR A COMPUTER PROGRAM LISTING COMPACT DISK APPENDIX

Not Applicable.

AUTHORIZATION PURSUANT TO 37 C.F.R. § 1.71 (d)

A portion of the disclosure of this patent document contains material which is subject to copyright and trademark protection. The copyright owner has no objection to the facsimile reproduction by anyone of the patent document or the patent disclosure, as it appears in the Patent and Trademark Office patent file or records, but otherwise reserves all copyrights whatsoever.

BACKGROUND OF THE INVENTION

Field of the Invention

As disclosed, the Smart Candle Platform and System is a lighting device and system using natural fuel such as oil or wax providing a structure for an improved lighting experience. In at least one embodiment, the interiorly positioned candle assembly allows for a replaceable outer shell and offers improvements in safety via the spring-loaded bottom feed of the candle assembly. In others embodiments, ignition, control and communication systems may be added to the Smart Candle Platform and System for electrical or electronic control for enhanced safety and enjoyment during operation. Candle light is desirable and consumers enjoy it as a "romantic" or "natural" light source. However, traditional candles and their operation are generally less than desirable because of operating and safety concerns.

The Smart Candle Platform and System as disclosed overcomes many common operating and safety issues of using a living flame "candle", subject to a particular configuration. As is well known, lit candles are a common cause of fires, particularly from accidents involving tipping or falling. For example, when something falls on top of or is too close to the candle flame it can cause a fire. Also, for example, if a candle is not assembled properly then an incidental fire can result and/or accumulation and spillage of hot wax resulting in a mess and annoyance. As is well known, typical candles are manually operated and require direct user contact wherein the user has to go to each candle and light/extinguish it manually and individually. This also limits candle placement options.

SUMMARY OF DISCLOSURE

The Smart Candle Platform and System as disclosed contemplates a lighting system providing the beauty and romance of the natural or living flame candle using a frame and structure that allows for use with a multitude of various systems to enhance safety and operation including a plurality of sensors, a control system and a communications system(s) to enhance safety, improve control and generally improve enhance the user experience while providing an aesthetically pleasing package comparable to a traditional wax pillar candle. In one embodiment, the Smart Candle Platform and System may be configured as a "Simple Candle" using the unique inner frame, top cover, candle assembly (or fuel assembly) and base along with a replaceable cosmetic outer shell for enhanced safety and operation. In one embodiment, a wax overflow trough may be incorporated proximate the top cover aperture. In one embodiment flame positon control may be incorporated. The Simple Candle may be also incorporate scents via direct injection or via a scent infused ring proximate the live flame. See FIG. 3E herein illustrating a simplified view of a possible scent ring 47 useful with the present disclosure positioned adjacent to a sensor pcb 39 and ignitor ring 36. The Simple Candle may also incorporate the improved safety allowed by a candle or fuel assembly which feeds from the bottom versus the top. The basic structure of the bottom versus the top.

In one embodiment, the Smart Candle Platform and System may also be configured with at least one, if not all of the features of the Simple Candle, and further incorporate at least one of the following additional elements for additional safety to produce a "Safe Candle" having a replaceable outer shell which is safer to operate and implements basic technology which may allow for self-extinguishment during unsafe condition, alone or in combination, including an exhaust fan and/or a pressurized $CO_2$ canister for flame extinguishment. The "Safe Candle" may also incorporate at least one sensor indicating tilt or turnover, an object proximity sensor in relation to the live flame, and at least one sensor indicating continuity failure of the Smart Candle Platform, i.e. dis-engagement of the base from inner sleeve, by way of example, without limitation or restriction. In one embodiment, a microcontroller unit may be implemented to coordinate data collected via the at least one sensor and at least one system for control. The Safe Candle embodiment may include a battery pack or receive power from an external source such as a cigarette lighter or a standard wall plug for use with a home electrical system.

In one embodiment, the Smart Candle Platform and System may also be configured with at least one, if not all of the features of the Simple Candle and the Safe Candle embodiments, and further incorporate at least one of the following additional elements for additional enjoyment to produce a "Smart Candle" configured for communication and control via a smart phone and/or smart phone app.

In one embodiment of the Smart Candle Platform and System, a control system may be added, which may be as simple as an on/off switch, for turning the system on/off. When combined with a smart phone app., this operation may be completed remotely. As will be disclosed herein, in one embodiment, the addition of tipping/fall sensors (aka an accelerometer) triggers (controls) the extinguishing of the flame and prevents the ignitor (burner) from being engaged and may be implemented in some manner or degree with the Simple Candle, the Safe Candle or the Smart Candle, and combinations therein.

In one embodiment of the Smart Candle Platform and System, the addition of a proximity sensor similarly prevents a flame from being present when something violates the "safe" proximity zone—for example if a curtain is obstructing or contacting the candle shell. In another embodiment of the Smart Candle Platform and System, inclusion of a continuity sensor prevents generation of a flame when the fuel cartridge, the igniter and/or the aperture are not properly assembled or aligned.

In one embodiment, a continuity sensor positioned between the inner sleeve and base prevents generation of a flame if there is improper alignment or dis-engagement between the base and inner sleeve.

In one embodiment of the Smart Candle Platform and System, a fuel level sensor may be incorporated to provide indication to the user of the need to refuel, further, the sensor may be connected to the control system to initiate auto-shutdown in the event of a fuel outage.

In one embodiment of the Smart Candle Platform and System, a flame detection system may be incorporated and may be integrated into a control system to initiate an automatic or semi-automatic shutdown in the event of an unsafe condition, i.e. detection of a flame external of the top cover aperture indicating the potential for ignition external the live flame.

In one embodiment of the Smart Candle Platform and System, a temperature sensor may be incorporated and may be integrated into a control system to initiate an automatic or semi-automatic shutdown in the event of an unsafe condition, i.e. high temperatures at the top cover indicating the potential for ignition external the live flame.

In one embodiment of the Smart Candle Platform and System, inclusion of a communication system would allow communication with a remote, computer or smart phone app. wirelessly via sound, voice, Bluetooth, Bluetooth Low Energy, WiFi, RF, cellular and or other wireless communications frequencies, or other existing "smart home standards" networks like i.e. Apple Home Kit, Google/Nest Thread, Zigby, WeMo, Z-wave, alone or in combinations therein to allow infinite user control for flexibility in lighting and extinguishing the smart candle(s) remotely either individually or by groups or zones. As one of ordinary skill will appreciate, this can be done with a single remote control or with a software application on a "smart phone" as an example. The communications can be managed directly via communications and control systems working alone or together to control either an individual smart candle, a group of smart candles communicating between each other or to a single hub and then out to the plurality of smart candles communicating with that hub.

BRIEF DESCRIPTION OF THE DRAWINGS

The accompanying drawings, which are incorporated in and constitute a part of this specification, illustrate embodiments and together with the description, serve to explain and illustrate the principles of the Smart Candle Platform and System (hereinafter referred to simply as the "Smart Candle Platform") as disclosed herein.

FIG. 2B-1 is a bottom view of the base with the base cap removed to illustrate the candle assembly positioned therein.

FIG. 2D-1 is an assembled bottom view of the base and inner cover with the base cap removed.

FIG. 3B-1 is a detailed view of FIG. 3B with the base removed to better illustrate the pcb affixed to the mid-frame and the position of the continuity sensor.

FIG. 3C-1 is a perspective view of the upper portion of the mid-frame with only the fan affixed therein providing a detailed view of the wax collection trough proximate the mid-frame aperture.

Figure 1:
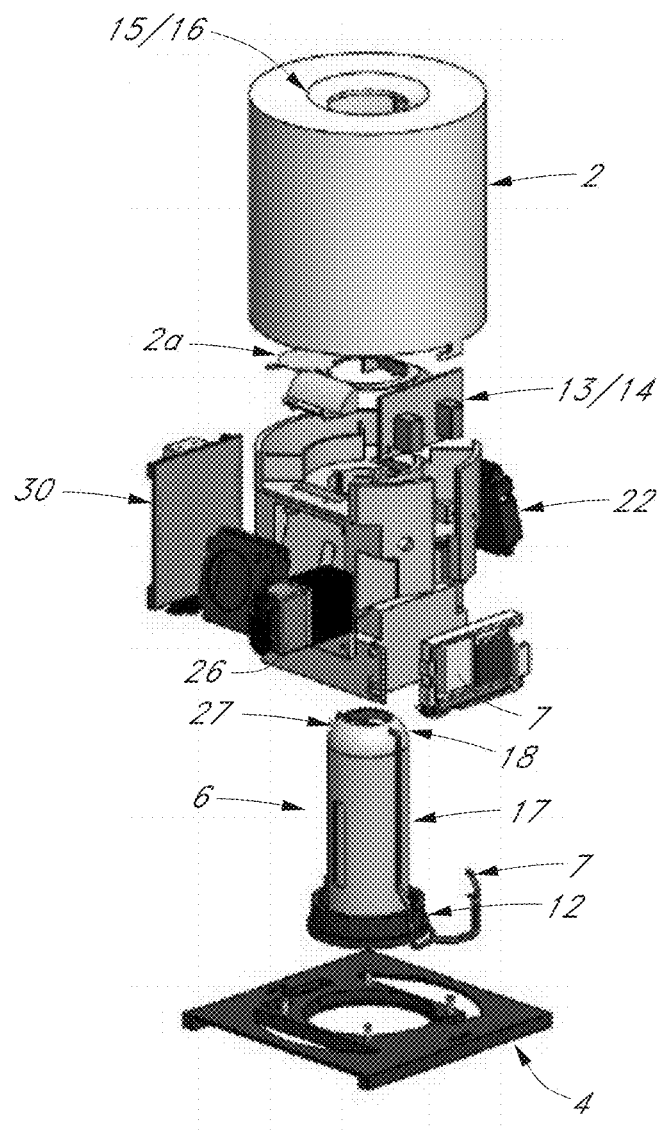
FIG. 1 is an exploded view of an embodiment of the Smart Candle Platform disclosed herein and the various interconnected sub-systems which may comprise the invention.

See also Appendix A construction drawings incorporated by reference herein.

DETAILED DESCRIPTION

TABLE OF ELEMENTS

| Element Description | Element Number |
| --- | --- |
| Lighting system | 1 |
| Outer shell | 2 |
| Opening | 2a |
| Rim | 2b |
| Mid-Frame | 3 |
| Mid-Frame upper annular shelf | 3a |
| Mid-frame lower annular shelf | 3b |
| Mid-frame axial compartment | 3c |
| Mid-frame lower tab | 3d |
| Mid-frame exhaust passage | 3e |
| Mid-frame aperture | 3f |
| Mid-frame opening | 3g |
| Mid-frame securement assembly | 3h |
| Mid-frame notch | 3i |
| Base | 4 |
| Base cap | 4a |
| Base ridge | 4b |
| Base shelf | 4c |
| Base-spring mount | 4d |
| Base void | 4e |
| Base-fastener assembly | 4f |
| Base tab | 4g |
| Candle Assembly | 5 |
| Fuel Cartridge | 6 |
| Ignitor (arc) | 7 |
| Fan | 8 |
| On/Off Switch | 9 |
| Smart Candle Platform and System | 10 |
| Sensor system | 11 |
| Continuity sensor | 12 |
| Accelerometer | 13 |
| Gyroscope | 14 |
| Proximity Sensor-magnetic field | 15 |
| Proximity Sensor-visual | 16 |
| Fuel level sensor | 17 |
| Flame sensor | 18 |
|  | 19 |
| Control system | 20 |
| Ignition control system | 21 |
| Ignition control system-electrical leads | 21a |
| Ignitor(s) | 21b |
| Extinguisher system | 22 |
| Infrared (IR) remote control | 23 |
| Timer | 24 |
| Fuel Control System | 25 |
| Power source-battery | 26 |
| Thermo-electric charging (Peltier) | 27 |
| Fuel Feed System | 28 |
| Fuel Storage System | 29 |
| Communications System | 30 |
| Inner cover | 31 |
| Inner cover-main aperture | 31a |
| Inner cover-securement assemblies | 31b |
| Inner cover-shelf | 31c |
| Inner cover-plateau | 31d |
| Top cover | 32 |
| Exhaust duct | 33 |
| Ignitor trough | 34 |
| Ignitor assembly | 35 |
| Ignitor ring | 36 |
| Ignitor channels | 36a |
| Ignitor exhaust aperture | 36b |
| Ignitor mount | 37 |
| Main PCB | 38 |
| Sensor PCB | 39 |
| Feeder tube | 40 |
| Aperture | 40a |
| Channel | 40b |
| Wax candle | 41 |
| Wick | 41a |
| Spring lock (pusher) | 42 |
| Spring | 43 |
| Base foot | 44 |
| IR sensor | 45 |
| Thermopile | 46 |
| Scent ring | 47 |
|  | 48 |
|  | 49 |
| Restricted access cover (not shown) | 70 |
| Locking tab | 72 |
| Flame | 100 |

DETAILED DESCRIPTION

Before the present Smart Candle Platform is disclosed and described, it is to be understood that the Smart Candle Platform is not limited to specific methods, specific components, or to particular implementations. It is also to be understood that the terminology used herein is for the purpose of describing particular embodiments only and is not intended to be limiting.

As used in the specification and the appended claims, the singular forms "a," "an," and "the" include plural referents unless the context clearly dictates otherwise. Ranges may be expressed herein as from "about" one particular value, and/or to "about" another particular value. When such a range is expressed, another embodiment includes from the one particular value and/or to the other particular value. Similarly, when values are expressed as approximations, by use of the antecedent "about," it will be understood that the particular value forms another embodiment. It will be further understood that the endpoints of each of the ranges are significant both in relation to the other endpoint, and independently of the other endpoint.

"Optional" or "optionally" means that the subsequently described event or circumstance may or may not occur, and that the description includes instances where said event or circumstance occurs and instances where it does not.

Throughout the description and claims of this specification, the word "comprise" and variations of the word, such as "comprising" and "comprises," means "including but not limited to," and is not intended to exclude, for example, other components, integers or steps. "Exemplary" means "an example of" and is not intended to convey an indication of a preferred or ideal embodiment. "Such as" is not used in a restrictive sense, but for explanatory purposes.

Disclosed are components that can be used with at least one embodiment of the disclosed Smart Candle Platform 10 and one embodiment of a control system 30 which may operate the Smart Candle Platform 10 via a remote control 31. These and other components are disclosed herein, and it is understood that when combinations, subsets, interactions, groups, etc. of these components are disclosed that while specific reference of each various individual and collective combinations and permutation of these may not be explicitly disclosed, each is specifically contemplated and described herein, for all potential embodiments of the Smart Candle Platform 10. This applies to all aspects of this application including, but not limited to, components of a Smart Candle Platform 10. Thus, if there are a variety of additional components that can be added it is understood that each of these additional components can be added with any specific embodiment or combination of embodiments of the Candle Platform 10. The present Smart Candle Platform 10 may be understood more readily by reference to the following detailed description of preferred embodiments and the examples included therein and to the Figures and their previous and following description.

In one embodiment, the lighting system of the Smart Candle Platform 10 may be constructed of material of sufficient strength and durability to facilitate low cost production and consumer use for light, decoration and general enjoyment. It is contemplated that in the illustrative embodiment shown in the enclosed figures may be constructed of, but not limited to, any metal or combination of metals including bronze, steel and aluminum; plastics or carbon fiber including Kevlar®, foam-blown polyurethane, thermoplastic polyurethane, ethylene vinyl acetate, other polymers, other thermoplastics, carbon rubber, blown rubber polymers, acrylics, composite materials, natural materials (e.g., rubber, leather, etc.), elastomers, combinations thereof, and/or any other material with suitable characteristics (e.g., compressive strength, stability, elasticity, density).

FIG. 1 provides a front perspective view of one illustrative embodiment of the Smart Candle Platform 10 illustrating an exploded view with call-outs to facilitate description of the various interconnected systems which may be implemented in the Smart Candle Platform 10 as disclosed including without limitation or restriction a lighting system 1, a sensing system 11 comprised of at least one condition sensor detecting and receiving input from either the environment or the operation of the Smart Candle Platform 10, a control system 20 and a communications system 30. Illustrative examples could include flame sensing via pyrometer or a thermopile array; flame proximity could be sensed via sensors including an infrared (IR) transmission/receiver type array.

In one embodiment of the Smart Candle Platform 10 as disclosed the lighting system 1 includes an external facade (outer 2) that appears like a typical "dumb" candle and is customizable and may be made of solid wax, which is not used as fuel, plastic, or acrylic or any other material that is suitable and desirable for a particular application. Although shown having a round shape, the outer shell 2 having an opening 2a from its along its axis (length) therein may have any shape, color, texture and transparency or opacity desirable to consumers and that can be manufactured by those of ordinary skill in the arts. The outer shell 2 could be constructed of any material that allows for transmission or reflection of light and that is sufficient to handle the heat expected during operation of a candle flame including steel, carbon, glass, ceramic, plastic, solid wax, acrylics and or combinations therein, without limitation and/or restriction. For example, and without limitation or restriction, applicant believes the market desires the outer shell 2 to be manufactured from a wax type material to closely simulate a pillar wax type candle as is well known to one of ordinary skill in the art. The outer shell 2 is mounted to a mid-frame 3 which rests on and is attachable to a base 4. The mid-frame 3 and base 4 could be constructed of any material that is of sufficient strength to support the outer shell 2 and the various sensors and systems contemplated by Applicant to be positioned within the outer shell 2, or within close proximity of the outer shell 2 and mid-frame 3, for attachment to the mid-frame 3 therein including various metals, including steel, aluminum, carbon fiber, plastic and or combinations therein, without limitation and/or restriction.

As shown in FIG. 1, the actual fuel for the Smart Candle Platform 10 is supplied via a fuel cartridge 6, positioned on the base 4 within the outer shell 2, and attached to the mid-frame 3. The light and flame are positioned within the opening 2a of outer shell 2, similar to a typical "dumb" solid wax candle well known to those of ordinary skill in the art. As illustrated in FIG. 1, the fuel is typically fed from the bottom such that the lighting system 1 flame (not shown) is generally positioned at the top of the external facade (outer shell 2) of the Smart Candle Platform 10 creating a uniform look and feel for the natural flame candle experience. One of ordinary skill will appreciate that the Smart Candle Platform 10 as disclosed herein may use a wick and solid wax for its fuel in one embodiment. Wax from soy, beeswax, paraffin, soy, palm, essential oils and or combinations therein.

One of ordinary skill will also appreciate that the present disclosure may include other types of fuel cartridges 6 which may be used including tanks and gas containers (not shown). Fuel cartridge 6 as disclosed is not limited to a wick and solid wax and that other fuels that may be combusted for production of a pleasant flame and/or odor and may be substituted without limitation including propane, butane, liquid wax, solid wax pellets, and/or natural and man-made oils. The Smart Candle Platform 10 may be configured to produce candle light using a natural wax candle as its fuel source or any other fuel source which is desirable and capable of producing light including wax from soy, beeswax, paraffin, soy, palm, essential oils and or combinations therein. The Smart Candle Platform 10 may be configured to produce candle light using a fuel cartridge 6 as shown herein. Liquid fuels (oils) available as fuel may include paraffin, soy, veggie, fatty acid, essential oils and or combinations therein. Further, one of ordinary skill will appreciate that the fuel chosen may be odor free or have fragrance added for an enhanced experience, without limitation or restriction. Although not shown, it is contemplated that fragrance could be added to the Smart Candle Platform 10 as disclosed by either addition directly to the fuel burned or via a separate tank or container type system having its own controls, without limitation or restriction. Although not shown, it is also contemplated that fragrance could be added to the Smart Candle Platform as disclosed via an electrical system that only "heats" or "re-heats" the scented/fragrant oils/materials through a system of electrical resistors vs. combustion. Applicant incorporates by reference herein the following US patents related to fuel control systems and auto-feeding systems as related to candles and lighting systems including: U.S. Pat. Nos. 4,186,430; 6,030,093; 5,722,763; 5,688,040; 5,424,928; 4,566,055; 4,260,365; 4,186,430; 3,867,625; 3,091,106; and 343,461. Applicant incorporates the preceding US Patents for further enablement and description of the present disclosure without admission as to the scope of teaching or the relevance of any particular reference or combinations of references as related to the patentability of the present disclosure.

In this particular embodiment of the Smart Candle Platform 10, a basic control system 20 includes a "hard" on/off switch 9 which could be positioned on the base 4 or the interior or exterior of the outer shell 2 for convenient access with minimal aesthetic distraction. (Not shown) As will be discussed further herein, a proximity sensor (either a magnetic field type 15 and/or a visual type 16) may be positioned proximate the opening 2a and on or within the outer shell 2 to detect whether there is a physical obstruction or barrier from the outside environment, in relation to the Smart Candle Platform 10. As shown, the Smart Candle Platform 10 may be powered internally via a battery 26 that may be mounted to the mid-frame or positioned in the base 4 or within the interior of the shell 2. Although not shown, one of ordinary skill will appreciate that the Smart Candle Platform 10 may be powered externally. In another embodiment, a thermo-electric charging system 27 could be installed alone or in combination with a battery 26, based on Peltier principles, to produce electrical current for use or supplementation of other power sources, using the heat produced by the burning fuel. In other embodiments, power could be provided from an external source including a common electrical outlet or solar power system (not shown), all of which are well known to those of ordinary skill in arts.

The Smart Candle Platform 10 as disclosed has an ignition control system 21 which ignites the fuel delivered via the fuel cartridge 6 through generation of an arc via an ignitor 7, which is well known to one of ordinary skill in the art. In one embodiment of the Smart Candle Platform 10 disclosed, a continuity sensor 12 could be positioned proximate the ignitor 7 and in communication with the control system 20 to monitor the position of the fuel cartridge in the base 4 to ensure proper engagement/contact prior to ignition of the fuel (wick). (Not shown) (See FIGS. 2E-3B and supporting description therein for additional enabling description for this embodiment)

As disclosed and contemplated, in one embodiment, the control system 20 of the Smart Candle Platform 10 may also include a fuel control system 25 connected to a fuel level sensor 17 which could be used to provide an alert to the user that more fuel is needed, per any one of the communication methods described further herein. In other embodiments, and subject to the particular fuel and configuration selected, the fuel level sensor 17 could be connected to an automated fuel feed system 28 (not shown) allowing for the introduction of more fuel from a fuel storage system 29 (not shown) into the fuel cartridge 6. In one embodiment, the fuel level could be sensed via an optical camera system. In another embodiment, the fuel level sensor 17 could signal the fuel control system 25 to auto-feed the wick and/or the wax of the system, subject to the particular fuel and configuration chosen. (See also FIGS. 2E-3B and supporting description therein for additional enabling description for this embodiment)

As disclosed and contemplated, in one embodiment, the control system 20 of the Smart Candle Platform 10 may also include an extinguisher sub-system 22 that could be comprised of an electrically powered fan 8 (electrically connected to a power source—not shown) to "blow out" the flame when the Smart Candle Platform 10 is turned off via the control system 20 or when one of the installed sensors of the sensor system 11 detects a dangerous condition including for example and without limitation the following: an accelerometer 13 and/or gyroscope 14 working alone or in combination has/have detected the Smart Candle Platform 10 has changed position (tipping/tipped over) producing a fire hazard, sending a signal to the control system 20 to activate the fan 8 to "blow out" the flame (burning fuel) re-establishing "safe" conditions to the operation the Smart Candle Platform 10. (See FIGS. 2E-3B and supporting description therein for additional enabling description for this embodiment) Further, although not shown, other types of extinguisher systems 22 are contemplated and would include without restriction or limitation pneumatic piston and bladder combinations that would generate and disperse a blast of air useful in putting out a live flame. Additionally, a mechanical choke, such as butterfly valve, could be positioned proximate the flame and could be engaged for a similar purpose to snuff out the flame by limiting or restricting air to the live flame.

In at least one embodiment of the Smart Candle Platform 10, if any of the sensors (continuity sensor 12, accelerometer 13, gyroscope 14, proximity sensor—magnetic field 15, proximity sensor—visual 16, fuel level sensor 17, flame sensor 18 of the sensor system 11, alone or in combinations, detects a "unsafe" condition or conditions that violate the contemplated controlled operation of the Smart Candle Platform 10, then the control system 20 may initiate extinguishment of the flame via the extinguisher system 22 (via exhaust duct 33 and fan 8 as discussed at FIGS. 2-3) and/or the ignition system 21 by removing fuel from the flame and/or disabling the ignitor 7, to disable operation of the Smart Candle Platform 10. (See FIGS. 2E-3 and supporting description therein for additional enabling description for this embodiment)

As disclosed and contemplated, in another embodiment, the Smart Candle Platform 10 would have at least one control system 20, which could be an infrared (IR) remote control type 23 working within line-of-sight of the Smart Candle Platform 10. As disclosed, the remote control 23 would control the on/off switch 9 (not shown) mounted on the Smart Candle Platform 10 which may also control (trigger) the ignitor 7 of the ignition control system 21 and the fan 8 of the extinguisher system 22 deployed in the Smart Candle Platform 10. As disclosed and contemplated, in another embodiment, the Smart Candle Platform 10 would have at least one control system 20, which could be a timer system 24 which could work with the ignition system 21 and extinguisher control system 22 of the Smart Candle Platform 10. As disclosed, the timer 24 would also control of on/off switch 9 (not shown) mounted on the Smart Candle Platform 10 which may also control (trigger) the ignitor 7 of the ignition control system 21 and the fan 8 of the extinguisher system 22 deployed in the Smart Candle Platform 10, on either a pre-programmed time period (1 h, 2 h and/or 4 h) or a variable period time to be selected by the user (59 minutes). Upon expiration of the selected time period, the Smart Candle Platform 10 would shut down automatically.

The Smart Candle Platform 10 disclosed and claimed herein may be configured with a communication system 30 including appropriate transmitters and receivers, subject to the particular communication installed therein. The communication system 30 may allow communication and control between individual Smart Candle Platforms 10 and a smart phone (not shown) having a software application installed therein via communication with WiFi, Bluetooth, cellular and/audio type systems and combinations therein. The communication system 30 may also be configured to allow communication between groups of Smart Candle Platforms 10 allowing multi-device and zone type control via the various types of communication systems that may be installed therein.

The following modifications, although not shown, would be obvious to one of ordinary skill in the art in view of the present disclosure. The various elements of the Smart Candle Platform 10 may be separately formed and later engaged with one another (e.g., via mechanical fasteners, material fusing, chemical adhesives, etc.) or integrally formed. The materials used to construct the Smart Candle Platform 10 and various elements thereof will vary depending on the specific application of the Smart Candle Platform 10, but it is contemplated that steel, Aluminium, polymers, other synthetic materials, natural materials, and/or combinations thereof will be especially useful for some applications. Accordingly, the above-referenced elements may be constructed of any material known to those skilled in the art or later developed, which material is appropriate for the specific application of the Smart Candle Platform 10, without departing from the spirit and scope of the Smart Candle Platform 10 as disclosed and claimed herein.

Figure 2:
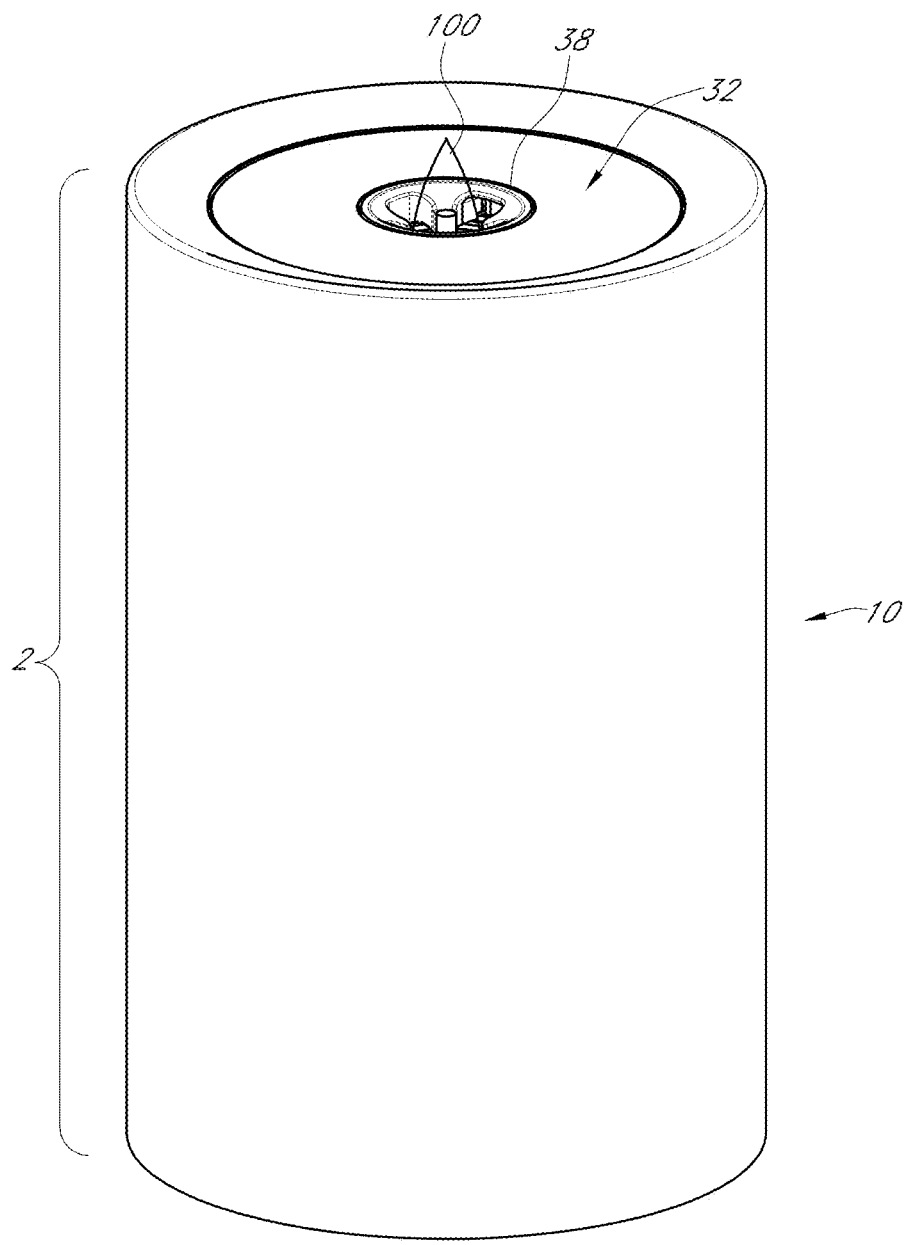
FIG. 2 is a perspective of the exterior portion of one embodiment of the Smart Candle Platform as disclosed herein during operation.

In another embodiment of the Smart Candle Platform 10 as disclosed and shown throughout FIGS. 2-3 includes an external facade (outer shell 2) that appears like a typical "dumb" candle and is customizable. Although shown having a round shape, the outer shell 2 having opening 2a therein may have any shape, color, texture and transparency or opacity desirable to consumers and that can be manufactured by those of ordinary skill in the arts that allows for transmission or reflection of all or portions of the electromagnetic spectrum or selected portions to enable a sensor(s), as disclosed or in use, that is sufficient to handle the heat expected during operation of a candle flame including steel, carbon, glass, ceramic, plastic and or combinations therein, without limitation and/or restriction. The outer shell 2 could also be constructed of any material that is pleasing to a user and may be constructed of plastic or wax to emulate a pillar candle. The outer shell can be constructed to be removable and/or replaceable so that the user may switch the outer shells to better match their decor or subject to holidays—red or green for Christmas and black or orange for Halloween or Fall by way of example and without limitation.

Figure 2A:
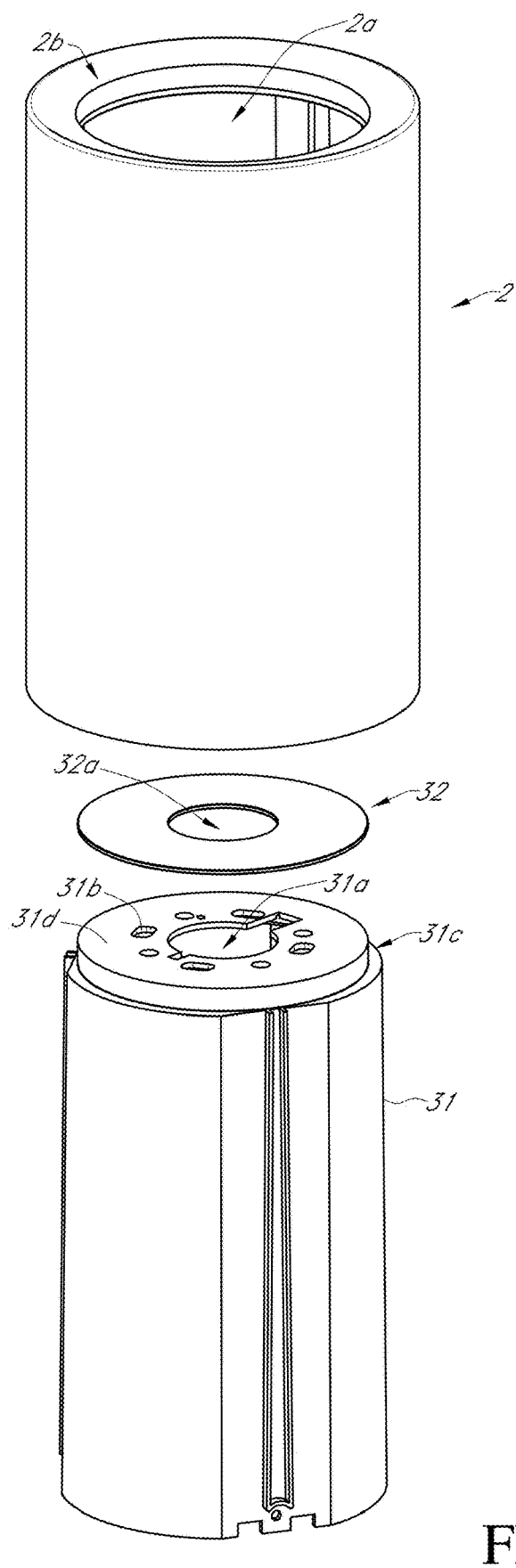
FIG. 2A is an exploded view of the Smart Candle Platform of FIG. 2 providing further construction and assembly details for the outer shell, top cover and inner cover.

FIG. 2 is a perspective of the exterior portion of another embodiment of the Smart Candle Platform 10 as disclosed herein during operation. As shown, the Smart Candle Platform 10 has a live flame 100 positioned with discharge from an ignitor ring 36 surrounded by a top cover 32 positioned in the upper portion outer shell 2. In this particular embodiment of a Smart Candle Platform 10, a candle 41 composed of wax having a wick 41a is the fuel and may have all attributes previously attributed and discussed regarding FIG. 1. One of ordinary skill will appreciate that scented operation could be added to the Smart Candle Platform 10 via scents in candle 41. (See infra) FIG. 2A is an exploded view of the Smart Candle Platform of FIG. 2 providing further construction and fabrication details. As shown in FIG. 2, the Smart Candle Platform 10 may be fabricated with an outer shell 2 having an opening 2a therein. An inner cover 31, also having main aperture 31a is shown positioned within and enclosed by outer shell 2 with top cover 32 positioned upon the upper portion of inner cover 31. As shown, the outer shell 2 has a hollow interior connecting an upper end and a lower end with a rim 2b positioned around the interior of the upper end, together forming a first opening 2a. An inner cover 31 having a hollow interior connecting an upper end and an open lower end is shown with a generally flat plateau at the upper end 31d formed by shelf 31c. A main aperture 31a is formed therein. The inner cover 31 is positioned within the first opening of the outer shell 2a. One of ordinary skill will appreciate that other embodiments of outer shell 2 and inner sleeve 31 may be constructed without rim 2b, plateau 31d and shelf 31c without restriction or limitation as required for a particular configuration or application. One of ordinary skill will note that various smaller apertures for securement assemblies 31b are positioned proximate and around main aperture 31b which when assembled are also proximate and positioned around opening 2a of the outer shell 2. Top cover 32 is non-conductive and acts as an insulator between inner cover 31 and outer shell 2. Top cover aperture 32a, first opening 2a, and main aperture 31a align. Further, top cover 32 may be aesthetically pleasing and may be either light reflective in support of wick 41a and flame 100 during operation. One of ordinary skill will appreciate that although top cover 32 is disclosed and described as being composed of glass, any material suitable for the particular application of a Smart Candle Platform 10 may be chosen including wax, plastic, ceramics as well as various metals including steel, aluminium and bronze and various combinations therein which may be reflective or optically transparent, as required by a particular application. Further, top cover 32 may have be configured to have an outer surface similar to outer shell 2 which may also be wax, having heat resistant properties as required by its proximity to the live flame.

Figure 2B:
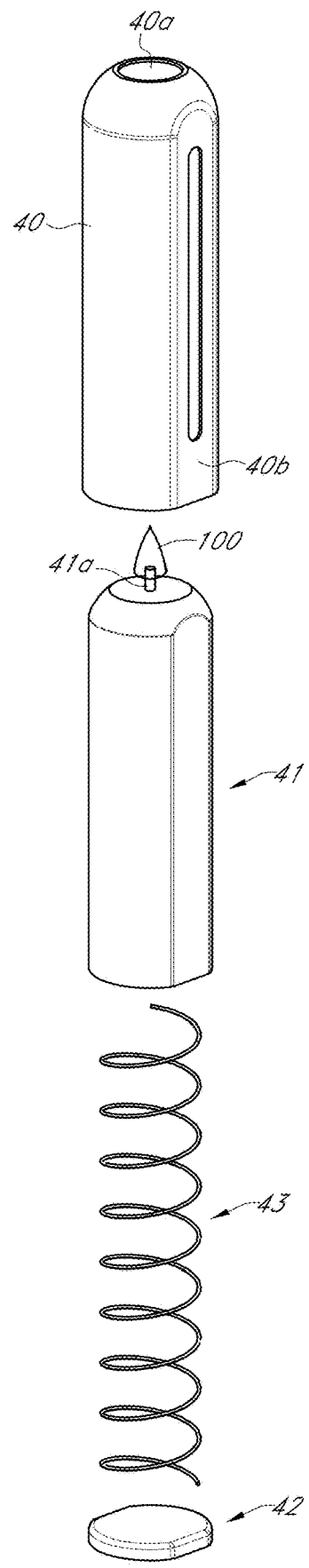
FIG. 2B is another exploded view of the Smart Candle Platform of FIG. 2 providing further construction and assembly details for the feeder tube, candle, spring and spring lock.
Figures 1, 2B:
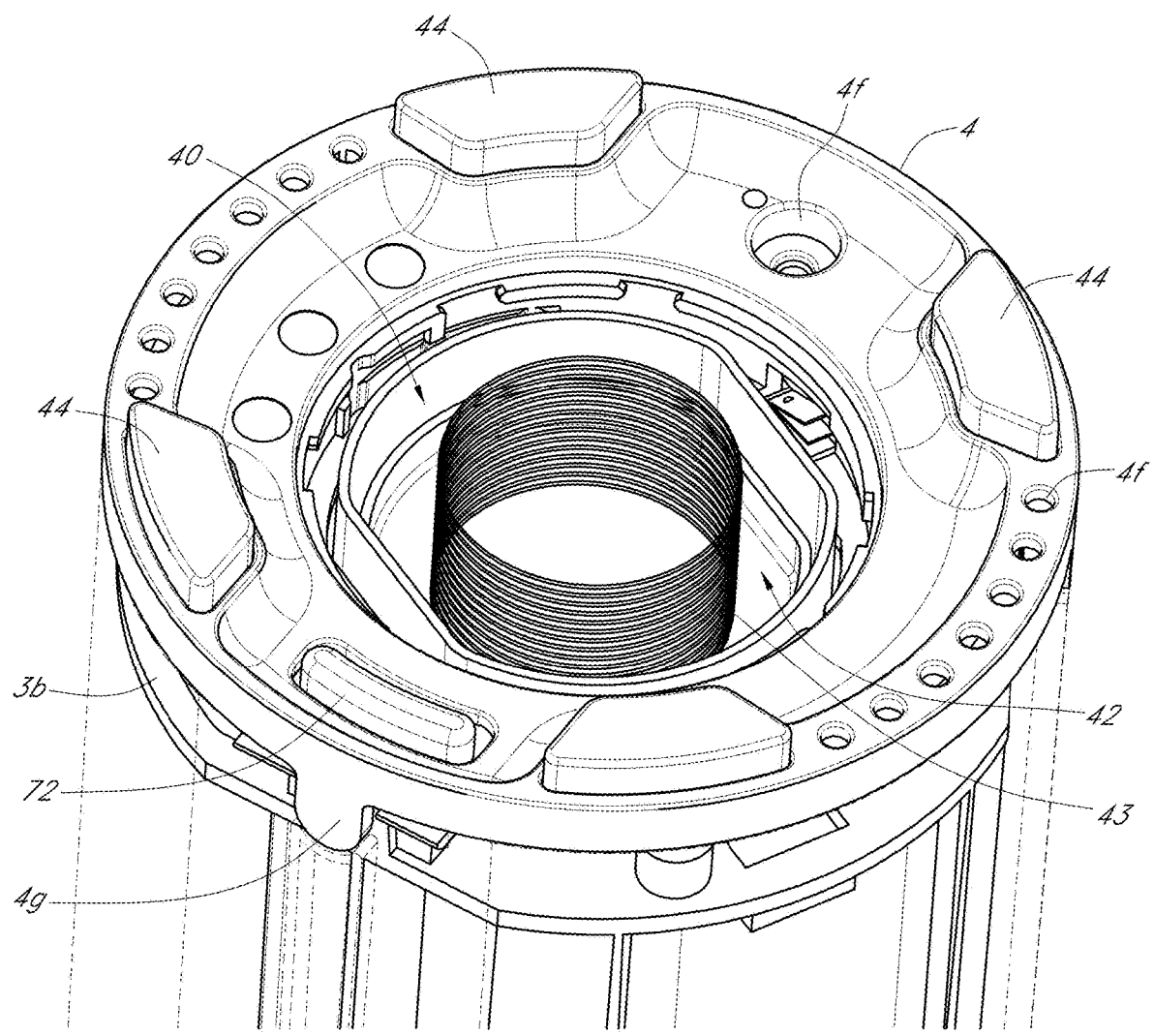

Exploded view FIG. 2B of the Smart Candle Platform illustrates one embodiment of a fuel (wax) and fuel feed system 28 shown as a candle assembly 5. As shown in this embodiment, the candle assembly 5 is a feeder tube 40 configured to be positioned in the aperture of the inner cover sleeve 31a, a wax candle 41 with wick 41a, spring 43 and candle pusher 42. One embodiment of the Smart Candle Platform 10 disclosed herein may be configured based on FIGS. 2A-2B wherein outer shell 2, top cover 32 and inner cover 31 having main aperture 31a therein, with candle assembly 5 positioned internally therein, upon engagement between base 4 and inner sleeve 31 forms a simple embodiment of a working live flame Smart Candle Platform 10. FIG. 2B-1 is a bottom view of the base 4 with the base cap 4a removed to illustrate the candle assembly 5 (feeder tube 40, candle 41, candle pusher 42 and spring 43) positioned therein with mid-frame 3. As shown, base 4 may be configured with a plurality of base feet 44. As shown, base 4 may also have base tab 4g positioned around the perimeter of the base 4 for coupled engagement with recesses 31e positioned around the perimeter of inner sleeve 31 or for coupled engagement with recesses positioned in the lower portion of the mid-frame 3. One of ordinary skill will appreciate that other configurations for locked engagement may be used without departure from the spirit and intent of the disclosure.

Figure 2C:
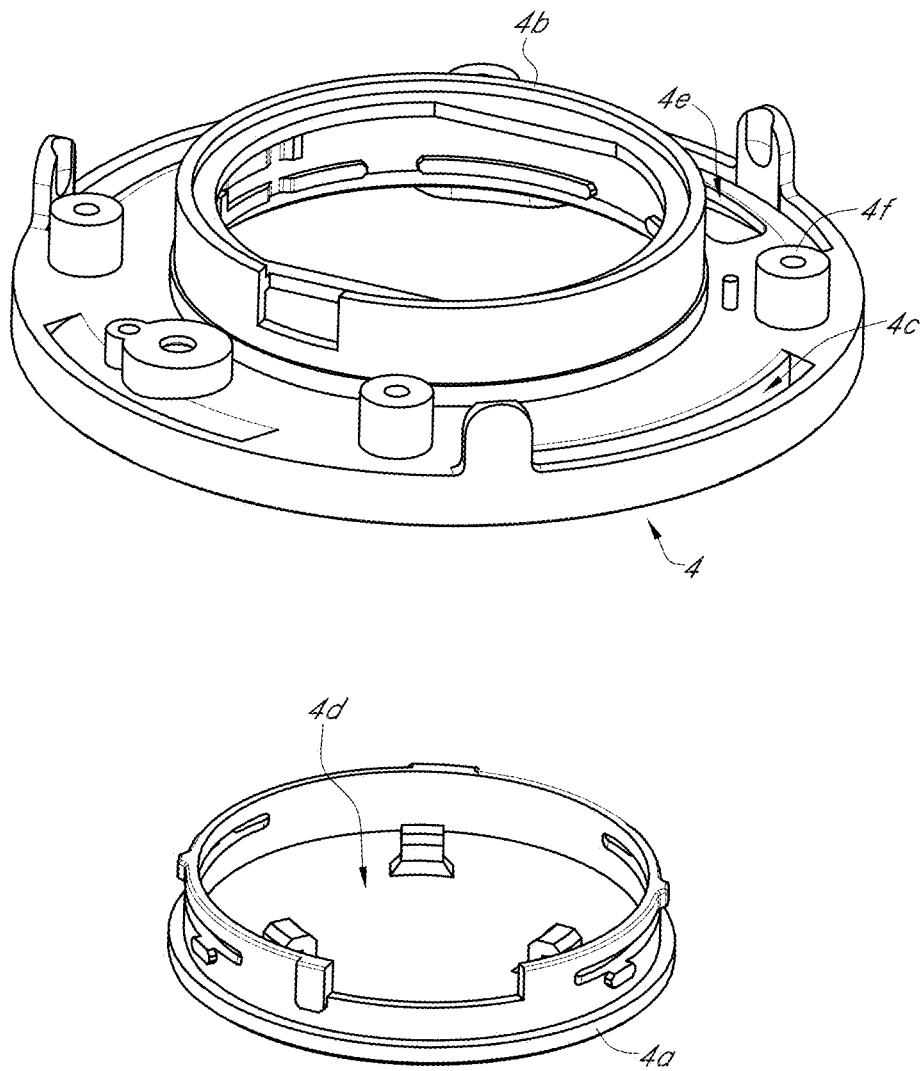
FIG. 2C is an exploded view of the Smart Candle Platform of FIG. 2 and particularly the base and base cap.

Further, as configured, the wax candle 41 is meant to advance automatically or semi-automatically via candle pusher 42 positioned against the bottom of wax candle 41 and is in communication with spring 43 which is positioned interior of base cap 4a of base 4 as shown in further detail in FIG. 2C. As shown, base 4 and base cap 4a work together with the lower end of inner sleeve 31 to operate as a wax lock during operation of the Smart Candle Platform 10. Although not shown, one of ordinary skill will appreciate that the base 4 and base cap 4a may work together with the lower end of inner sleeve 31 to contain a fuel refill and/or cartridge in other embodiments configured for a fuel cartridge 6 which could be configured for use of liquid fuel—such as soy oil. One of ordinary skill will appreciate that the upper end portion of the spring 43 make work directly against wax candle 41 without spring lock (pusher) 42 without departure from the spirit and intent of the present disclosure. Although not shown, one of ordinary skill will appreciate that a canister having a size and shape similar to the feeder tube configured with a wick 41a distending from an aperture positioned in the upper portion of the canister, wherein in the upper portion is a removable lid, could be one embodiment of fuel cartridge 6 useful for liquid fuel.

Figure 2D:
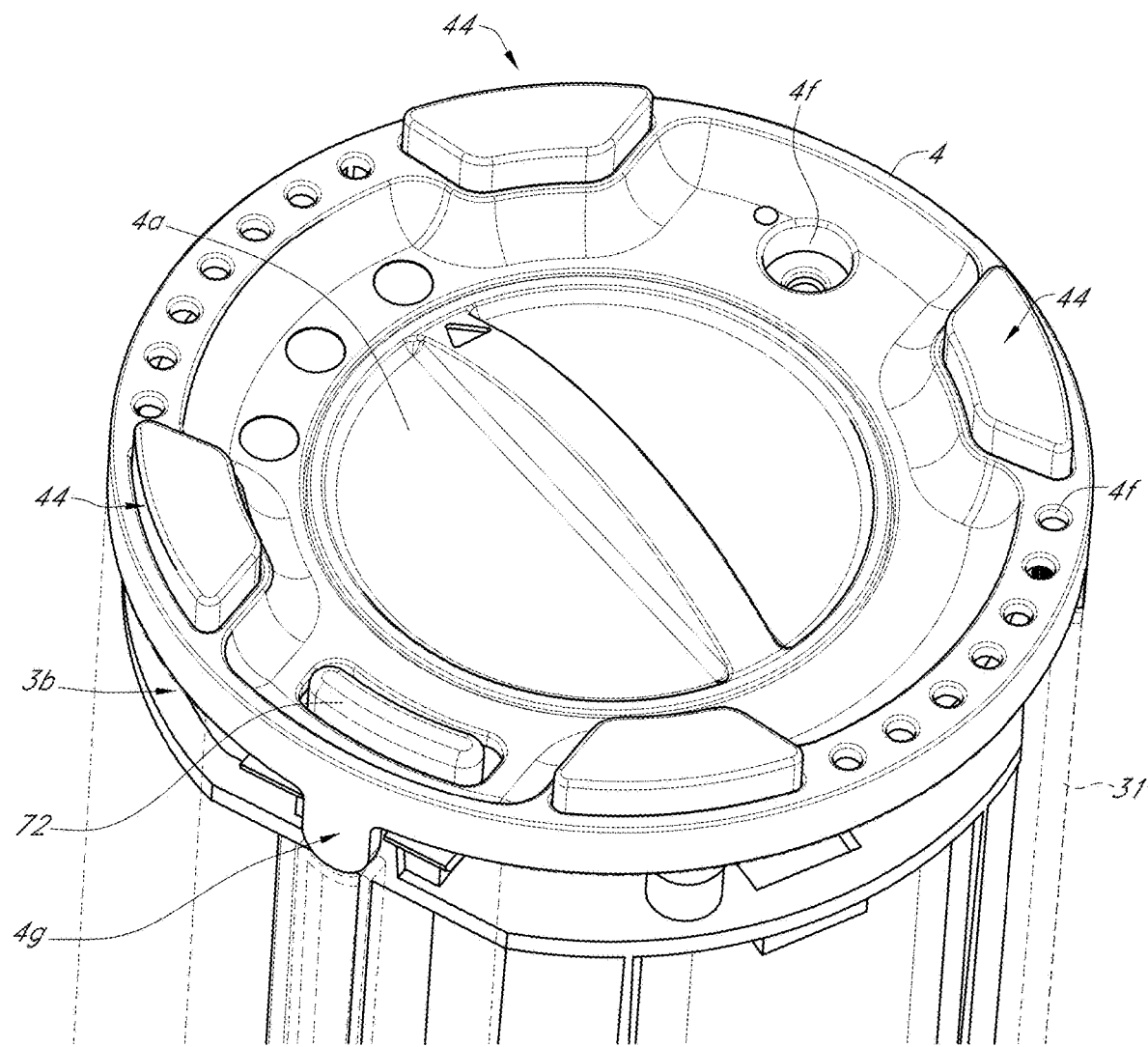
FIG. 2D is an assembled view of the Smart Candle Platform of FIG. 2 providing further construction and assembly details for the affixation of the lower portion of the inner cover to the base, base feet and base cap.
Figures 1, 2D:
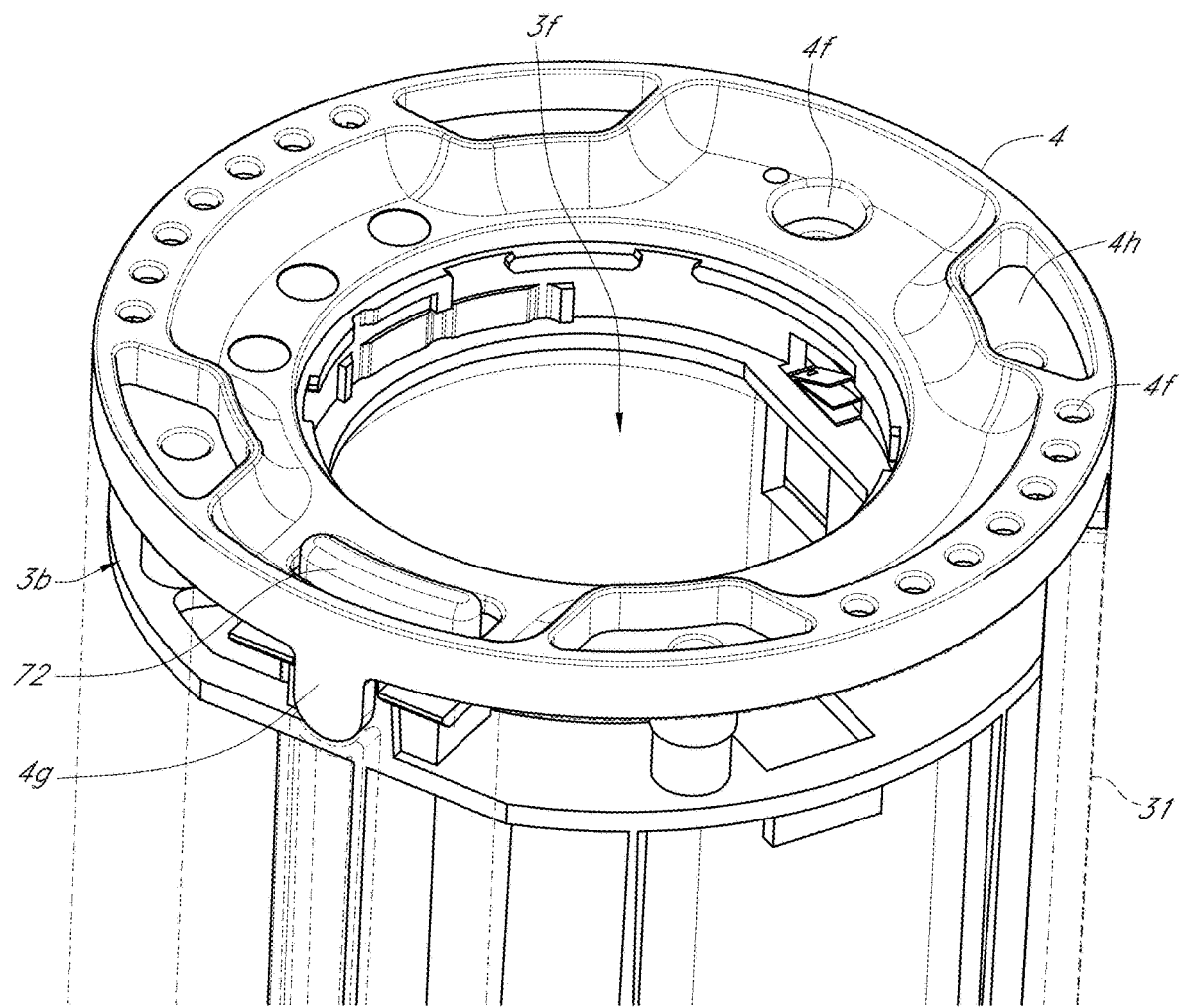
Figure 2E:
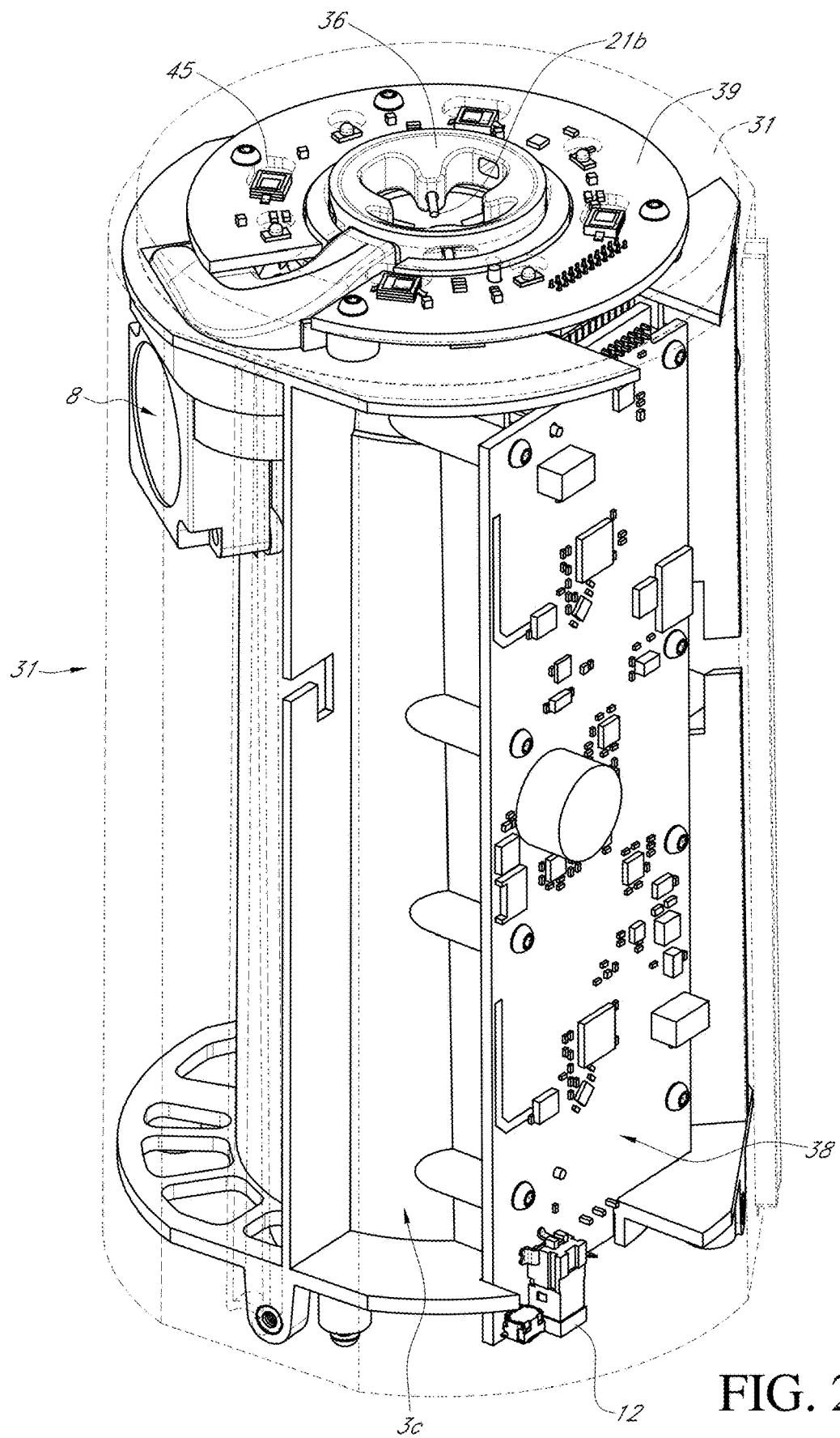
FIG. 2E is an assembled view of the Smart Candle Platform of FIG. 2 providing construction and assembly details with the inner cover enclosing the mid-frame with various electronic and operation components affixed therein to the mid-frame.

FIG. 2D is an assembled view of the Smart Candle Platform 10 of FIG. 2 providing further construction and assembly details for the slidable affixation of the lower portion of the inner cover to the base 4, base feet 44 and base cap 4a. As shown in FIGS. 2C base 4 is configured with annular base ridge 4b, base shelf 4c and base void 4e for slotted contact and engagement with the lower end of inner sleeve 31 shown in FIG. 2D. Inclusion of base tab 4g allows for fixed uni-directional engagement and assembly. Base 4 may be attached to the inner cover 31 via base fastener assemblies 4f which are apertures in which any fastener (glue, screws, bolts, expansion pegs and/or combinations therein) (not shown) may be positioned to fix the end of inner sleeve 31 to base 4. FIG. 2D-1 is an assembled bottom view of the base 4 and inner cover 31 with the base cap 4a removed as well as several base foot 44 to better show base pads 4h. FIG. 2E is an assembled view of the Smart Candle Platform 10 disclosed herein as embodied in either FIG. 1, 2, or 3 configured with an inner cover 31 enclosing a mid-frame structure 3 with various electronic and operation components affixed therein. As shown, the mid-frame 3 is configured to engage with and be surrounded by an inner sleeve 31 having a generally round shape. As shown, the mid-frame 3 includes an upper annular shelf 3a as well as a lower annular shelf 3b which are generally round in shape. One of ordinary skill will appreciate the present disclosure (FIGS. 1-3) is not limited to one particular shape but that the combination of outer shell 2, opening 2a, inner sleeve 31 and mid-frame 3 can be configured to any shape desired with this concentric interconnection design between the preceding elements. As shown in FIG. 2E upper annular shelf 3a and lower annular shelf 3b allow for the creation of a mid-frame axial compartment 3c into which a main pcb (printed circuit board) 38 may be affixed allowing for a control system 20 as discussed further herein. As disclosed herein, the main pcb 38 may have the following systems, system controls or connections, via either analog or digital systems, installed therein including a sensor system 11, a continuity sensor 12, an accelerometer 13, a gyroscope 14, a proximity sensor—via magnetic field 15, proximity sensor—via visual 16, a fuel level sensor 17, a flame sensor 18, a control system 20, an ignition control system 21, an extinguisher system 22, an infrared (IR) remote control 23, a timer 24, a fuel control system 25, a power source- battery 26, a thermo-electric charging (Peltier) 27, a fuel feed system 28 (including controls), a communications system 30, including either or both a wife or bluetooth transmitter(s) and receiver(s), and combinations therein collectively working separately or together supporting operation of a Smart Candle Platform 10 or Smart Candle Platforms 10 including a mesh network of Smart Candle Platforms 10. As shown, the recesses created by the upper and lower annular shelves (3a, 3b) provide adequate space to position the various components and systems disclosed through-out to allow for a compact, safe, aesthetically pleasing operational Smart Candle Platform 10 including for example fan 8 (shown in FIG. 2E), battery 26, ignition control system 21, ignition control system—electrical leads 21a and ignitor trough 34. As shown through-out FIGS. 2A-3D, the electrical connections between the various systems requiring electrical power may be positioned adjacent to and in either the ignitor trough 34 and/or mid-frame axial compartment 3c or other recesses located in the mid-frame 3 or combinations therein. One of ordinary skill will appreciate that a restricted access panel or cover 70 (not shown) having tab 72 positioned in base 4 may be required to ensure user access to the electronic components is limited as required by regulatory bodies and/or as recommended consumer product safety practices. (See FIG. 2B-1 and FIG. 2D)

Figure 2F:
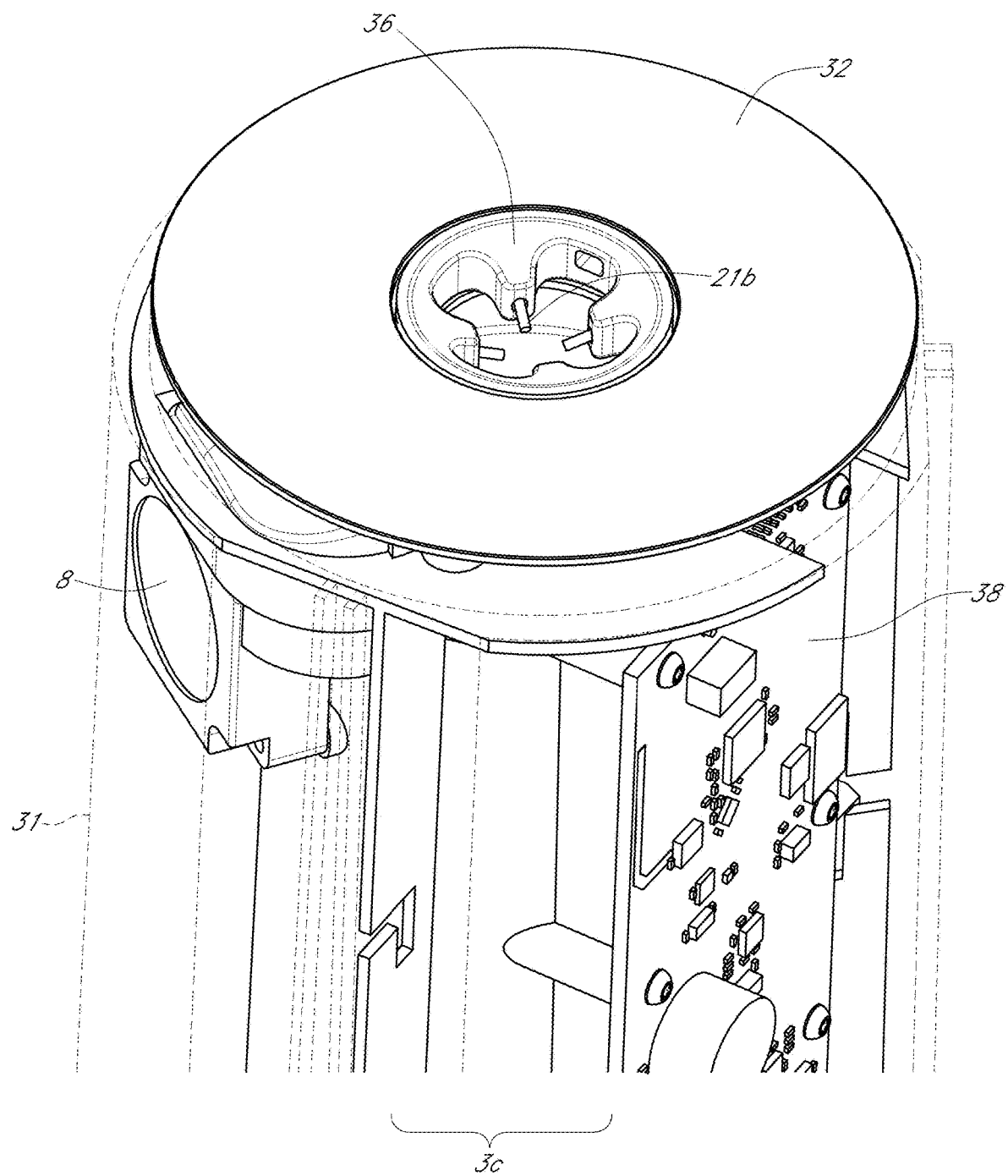
FIG. 2F is an assembled top view of the Smart Candle Platform of FIG. 2 providing construction and assembly details with the inner cover enclosing the mid-frame with various electronic and operation components affixed therein to the mid-frame and the top cover positioned therein.

FIG. 2F is an assembled top view of the Smart Candle Platform of FIG. 2 providing construction and assembly details with the inner cover 31 enclosing the mid-frame 3 with various electronic and operation components affixed therein to the mid-frame 3 and the top cover 32 positioned therein.

Figure 3A:
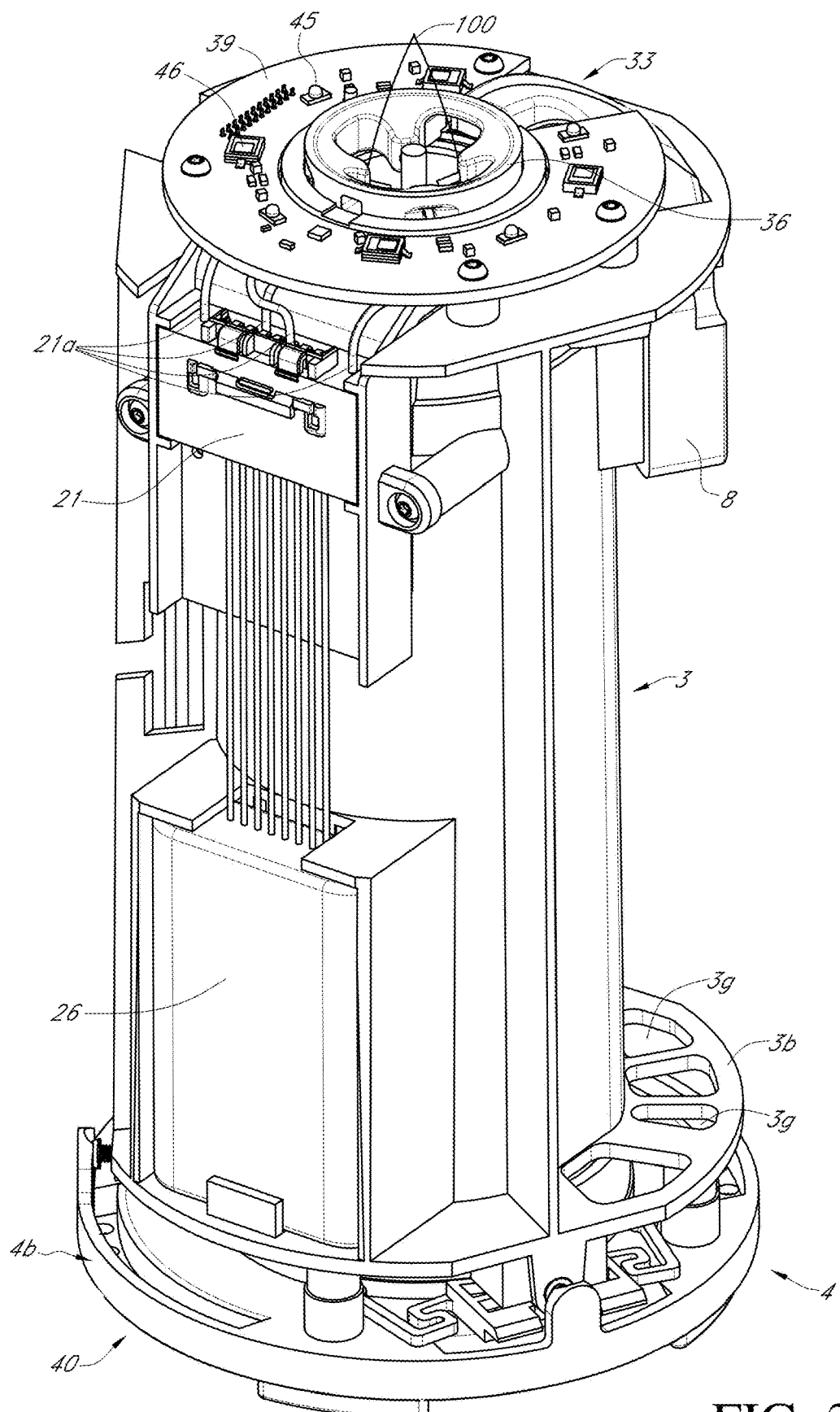
FIG. 3A is a perspective view of an embodiment of the Smart Candle Platform disclosed herein during operation with the outer shell, top cover and inner cover removed to better disclose the inner working portion of the Smart Candle Platform including the mid-frame resting on the base and various interworking components affixed therein.

FIG. 3A provides another perspective view of the Smart Candle Platform 10 disclosed herein during operation with the outer shell 2, top cover 32 and inner cover 31 removed to better disclose the inner working components of the Smart Candle Platform 10 including sensor pcb 39 with the mid-frame 3 resting on the base 4. As shown in FIGS. 2E, 3A, 3B and 3D, ignitor ring 36 is positioned on the upper portion of the mid-frame 3 extending out from the inner sleeve 31. As also shown in FIGS. 2E, 3A, 3B and 3D, sensor pcb 39 is positioned on the upper portion of the mid-frame 3 just under the inner sleeve 31. As disclosed herein, the sensor pcb 38 may have the following systems, system controls, or connections to it, installed therein including a sensor system 11, a continuity sensor 12, accelerometer 13, gyroscope 14, proximity sensor—magnetic field 15, proximity sensor—visual 16, fuel level sensor 17, flame sensor 18, control system 20, ignition control system 21, extinguisher system 22, infrared (IR) remote control 23, timer 24, fuel control system 25, power source—battery 26, thermo-electric charging (Peltier) 27, fuel feed system 28 (controls), communications system 30, including either or both a wife or bluetooth transmitter(s) and receiver(s) and combinations therein collectively working separately or together supporting operation of the Smart Candle Platform 10. One of ordinary skill will appreciate that multiple pairs of receivers and transmitters working together could allow formation of a mesh network comprised of a plurality of Smart Candle Platform(s) 10.

Figure 3B:
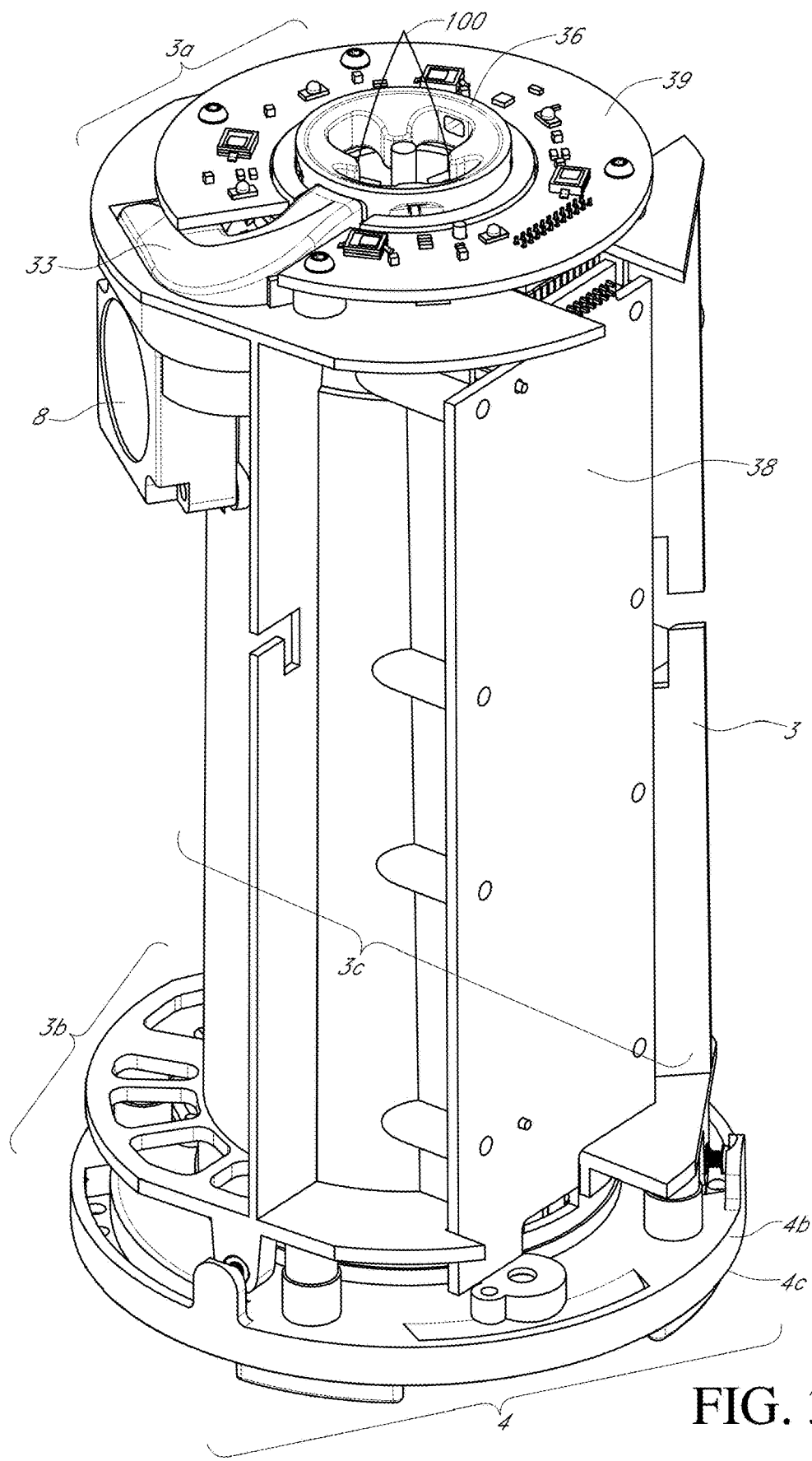
FIG. 3B is a perspective view of the other side of the mid-frame and various interworking components affixed therein resting upon the base as disclosed in FIG. 3 and throughout.
Figures 1, 3B:
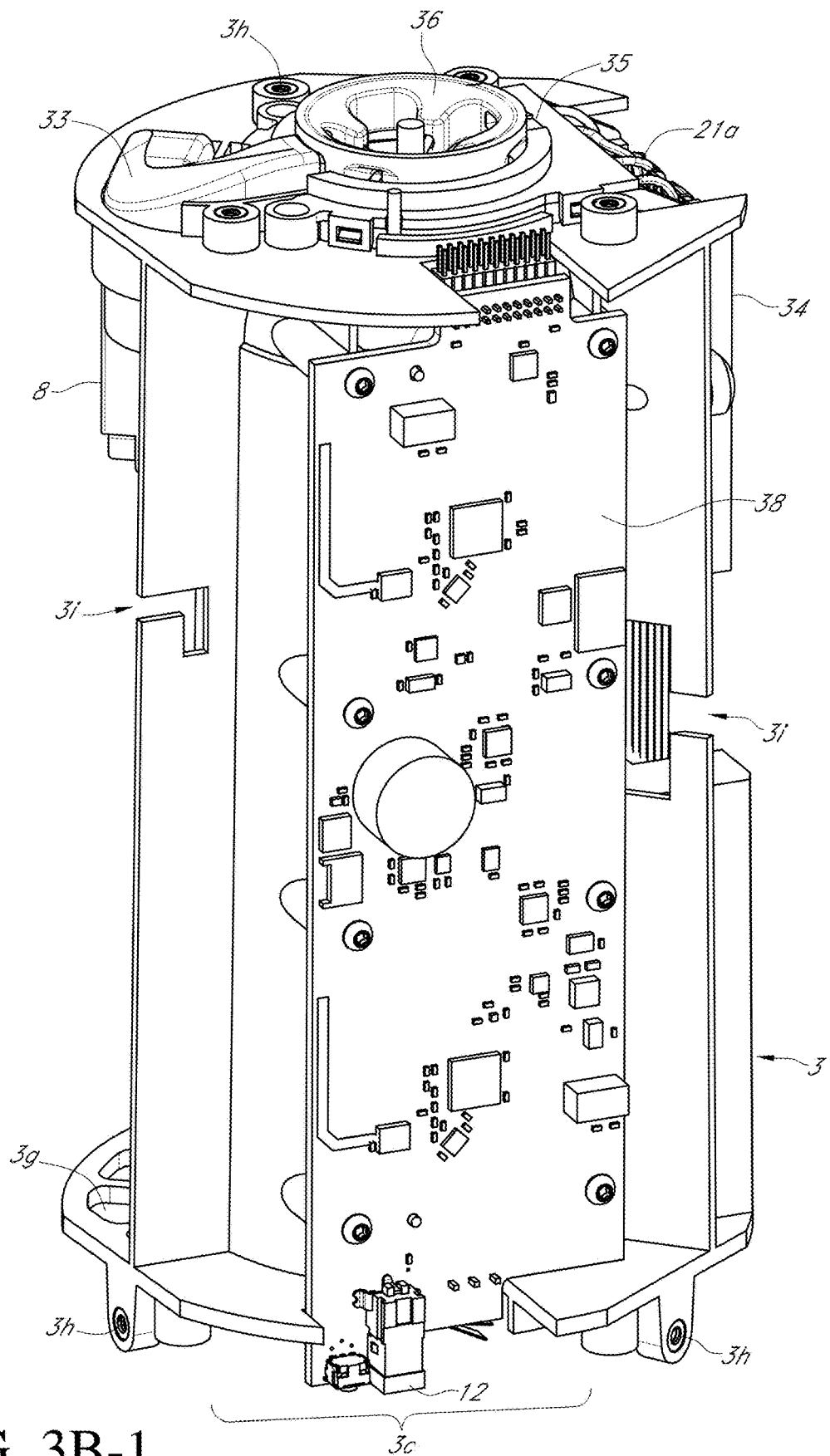

FIG. 3B is a perspective view of the other side of the mid-frame 3 including mid-frame lower tab 3d, mid-frame exhaust passage 3e and mid-frame aperture 3f having a main pcb 38 affixed in the mid-frame axial compartment 3c located between the mid-frame upper and lower annual shelves (3a, 3b) resting upon the base 4 and positioned for engagement with the base fastener assemblies 4f proximate the base ridge 4b and base shelf 4c. As shown, fan 8 is positioned in a recess located just under the upper mid-frame shelf 3a. Further, exhaust duct 33 is positioned in mid-frame exhaust passage 3e on the upper face of the mid-frame 3 in fluid communication with ignitor ring assembly 35 and ignitor ring 36.

FIG. 3B-1 is a detailed view of FIG. 3B with the base 4 removed to better illustrate the pcb 38 affixed to the mid-frame 3 in the mid-frame axial frame compartment and the position of the continuity sensor 12 between the lower portion of the mid-frame 3 and the base 4.

Figure 3C:
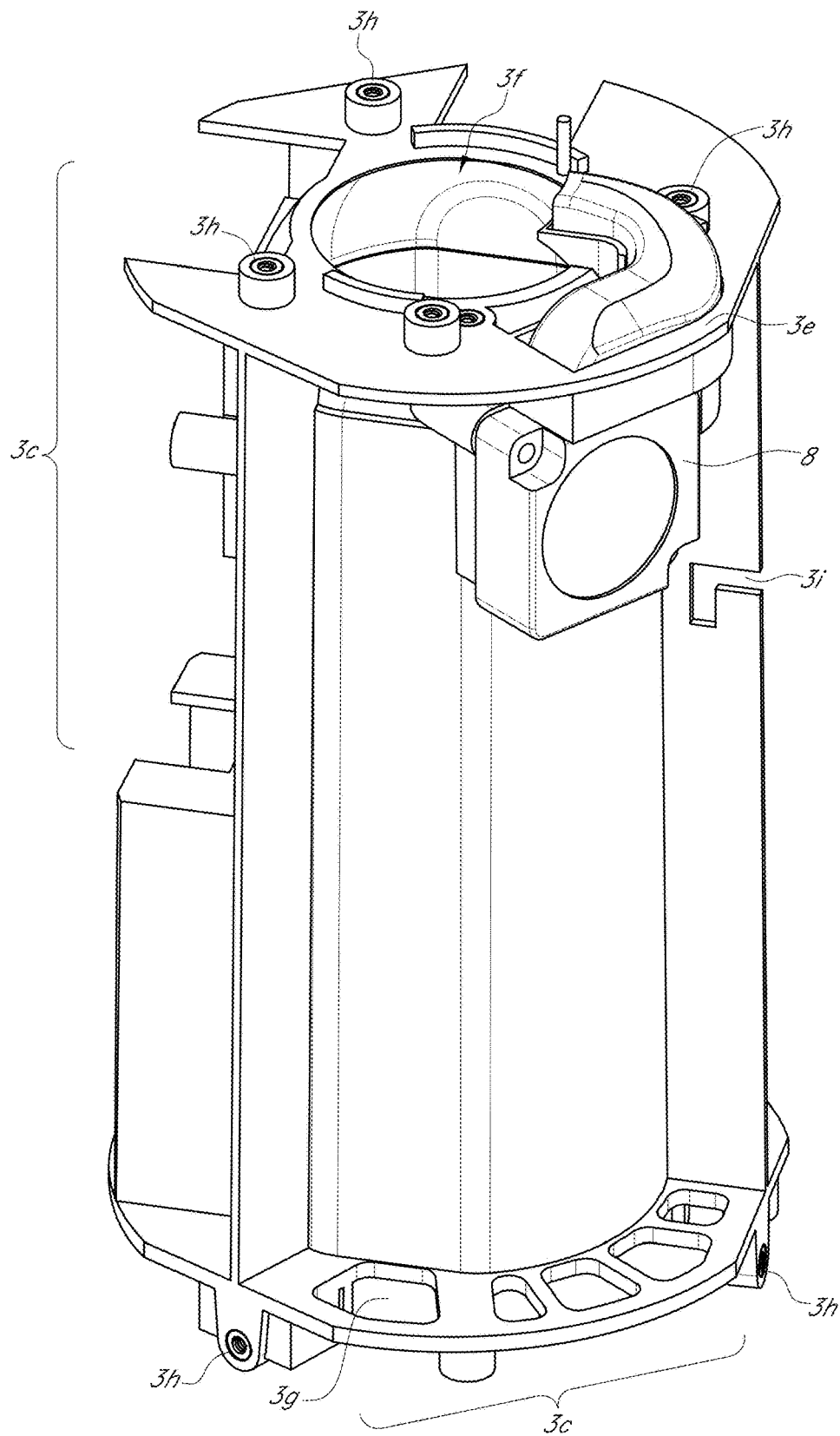
FIG. 3C is a perspective view of the opposite side of the mid-frame with only the fan affixed therein.
Figures 1, 3C:
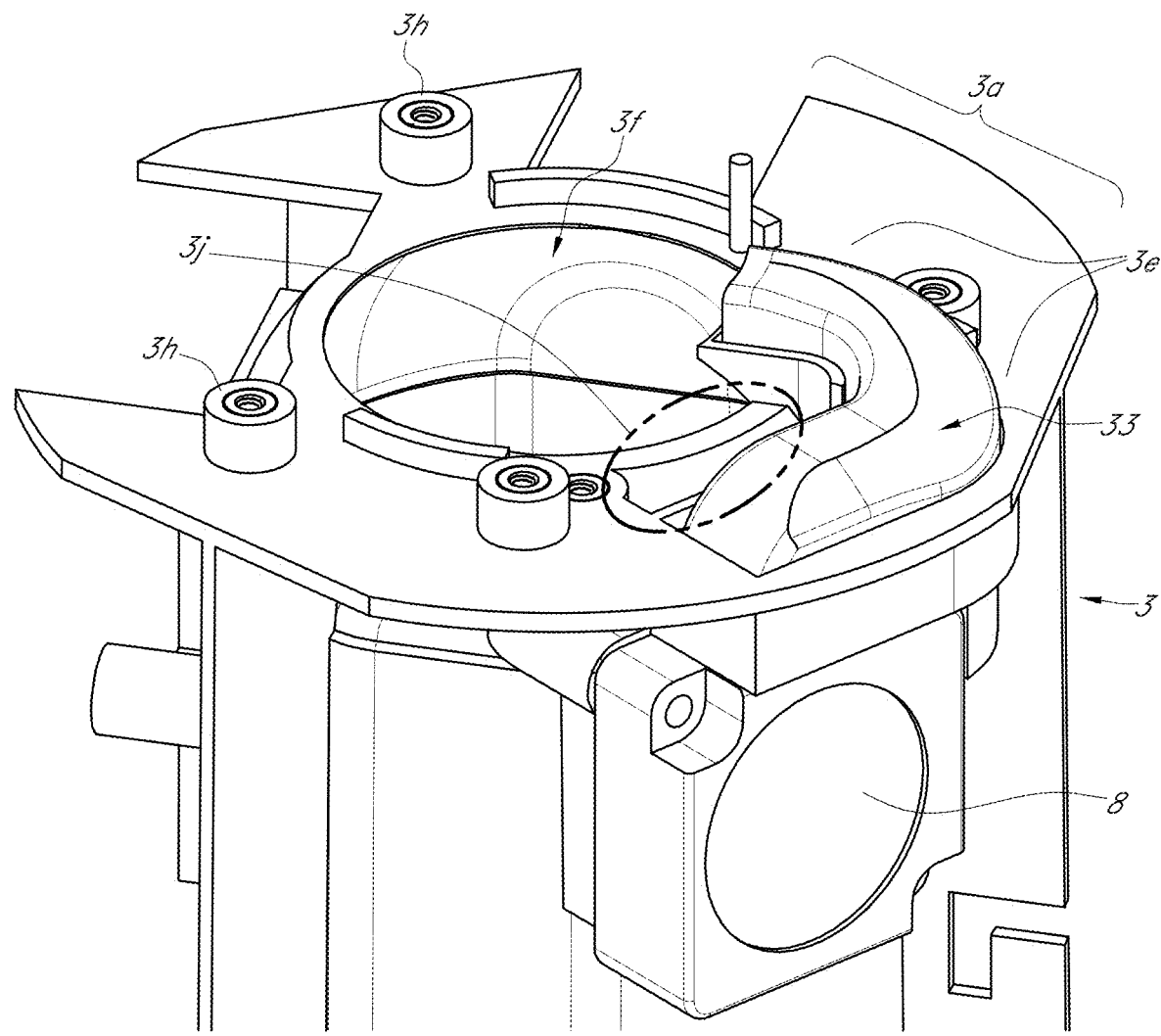

FIG. 3C is perspective view of the mid-frame 3 with only the fan 8 affixed to best illustrate the various components of the mid-frame 3 to illustrate the other side of the mid-frame 3. FIG. 3C-1 is a perspective view of the upper portion of the mid-frame 3 with only the fan 8 and exhaust duct 33 affixed therein. The upper portion of mid-frame is configured with a wax overflow collection trough proximate the mid-frame aperture 3f and mid-frame exhaust passage 3e for engagement with exhaust duct 33. As disclosed, fan 8 connected to exhaust duct 33 may be used as part of the extinguishment system 22 i.e. when a sensor 11a from a sensor system 11 is connected to the extinguishment system 22 provides a signal that there exists an unsafe condition, fan 8 may be operated to send a gust of air to the flame 100 to extinguish the flame 100. In other embodiments, fan 8 can be operated so as to remove or pull excessive smoke away from the flame 100 during operation and or in extinguishment mode, can be operated so as to rapidly remove the air around the flame 100 allowing for extinguishment and avoidance of unsafe operation.

Figure 3D:
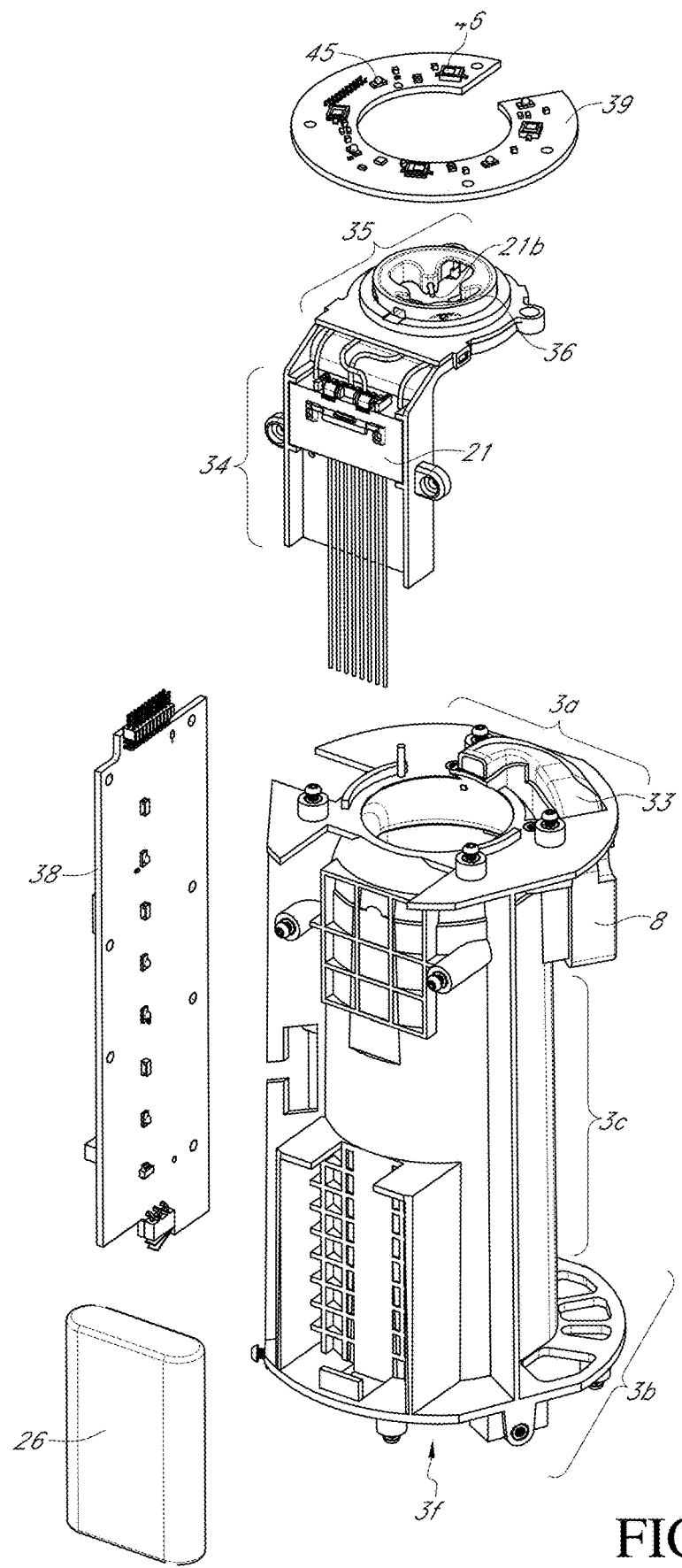
FIG. 3D is an exploded view of the embodiment of the Smart Candle Platform disclosed at FIGS. 2 and 3 illustrating the shape, position and relationship between the interior of the Smart Candle Platform as related to the mid-frame, the fan, the exhaust duct, gasket, ignitor, ignitor assembly, main pcb, battery, sensor pcb and electrical leads connecting the various powered components.

FIG. 3D is an exploded view of Smart Candle Platform 10 providing additional illustration of one embodiment therein particularly as related to the shape, position and relationship between the interior of the Smart Candle Platform 10 as related to the mid-frame 3, the fan 8, exhaust duct 3, ignitor 21*b*, ignitor assembly 35 positioned under ignitor ring 36 and base 4, main pcb 38, battery 26, sensor pcb 39 and electrical leads (ignition control system 21*a* and battery leads) connecting the various powered components of Smart Candle Platform 10. As disclosed herein, the sensor pcb 39 is illustrated having infrared (IR) sensors 45 and thermopiles 46 arrayed and arranged around the circumference of the sensor pcb 39. Applicant has found that at least one and preferably multiple IR sensors 45 and thermopiles working together improve monitoring and control of the wick 41*a* of candle 41 and particularly flame 100. Ignitor ring 36, having the clover-leaf shape as shown through-out, which surrounds the wick 41*a* and flame 100, has been found to be one configuration allowing multiple ignitors 21*b* for improved control of wick 41*a* and flame 100 solving the problem(s) of wick and flame migration.

Figure 3E:
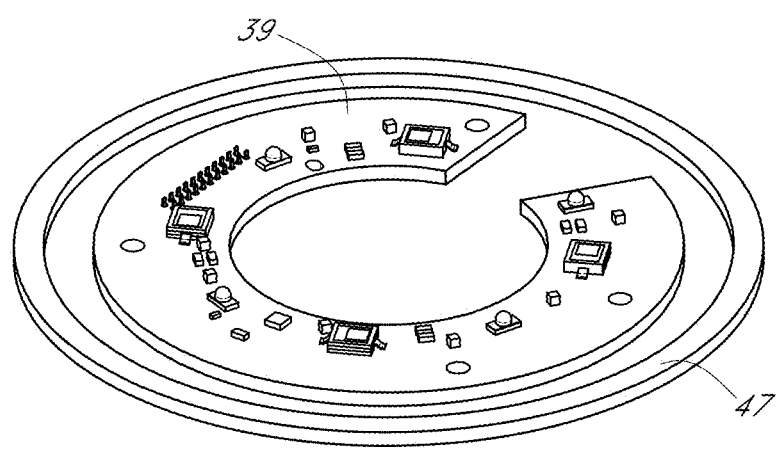
FIG. 3E is simplified view of a possible scent ring 47 useful with the present disclosure positioned adjacent to a sensor pcb 39.
Figure 4:
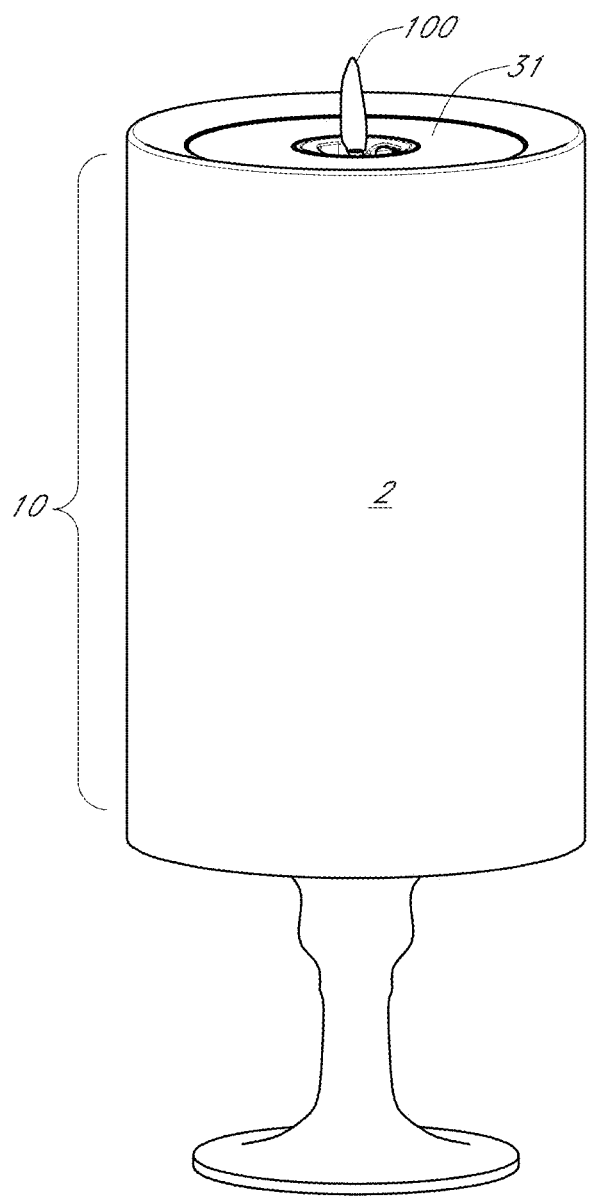
FIG. 4 is a first view of a Smart Candle Platform in operation which embodies at some of the various features disclosed herein.
Figure 5:
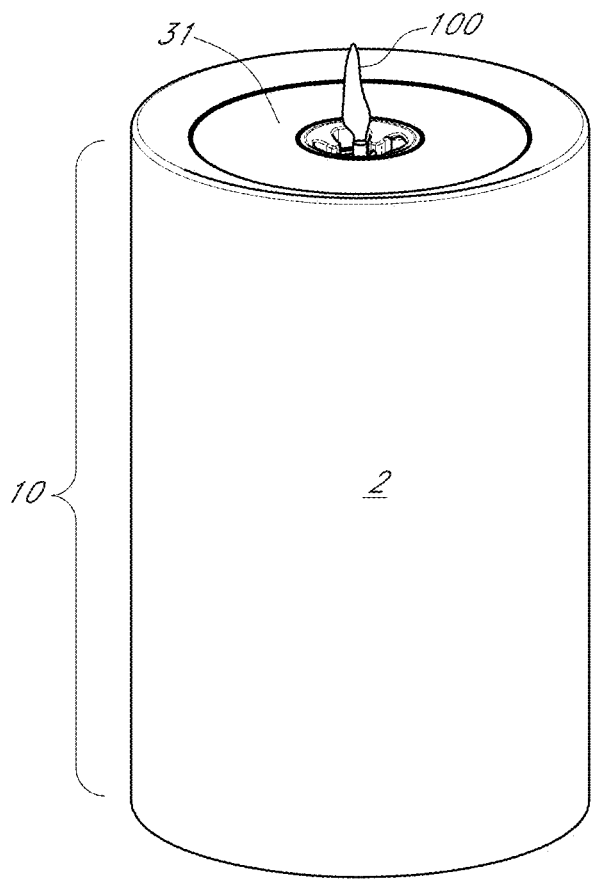
FIG. 5 another view of a Smart Candle Platform in operation which embodies at some of the various features disclosed herein.

FIG. 3E illustrates one embodiment of a scent ring 47 useful with the present disclosure positioned adjacent to a sensor pcb 39 and ignitor ring 36. One of ordinary skill will appreciate that the scent ring 47 may have any shape that works with a particular configuration of the Smart Candle Platform 1 disclosed herein. Further, the scent ring 47 may be used with a sensor pcb 39 and ignitor ring 36 as illustrated or may be used in a Smart Candle Platform 10 configured for use without a mid-frame 3 or ignitor ring 36 with the scent ring 47 positioned proximate live flame 100 to provide heat which may be useful in warming-up the scent ring 47 to activate the scent therein for distribution. The scent ring 47 may be positioned inside the sensor pcb 39 or external to the sensor pcb 39 as shown, without limitation or restriction, as required for a particular application or configuration.

One of ordinary skill will appreciate that other configurations allowing single or multiple ignitors may be selected for any particular application without departure from the spirit and intent of the present disclosure. One of ordinary skill appreciate that other types of methods of flame sensing/monitoring including pyrometers may be used with Smart Candle Platform 10 as disclosed herein without departure from spirit and intent of the disclosure.

Having described the preferred embodiments, other features of the Smart Candle Platform will undoubtedly occur to those versed in the art, as will numerous modifications and alterations in the embodiments as illustrated herein, all of which may be achieved without departing from the spirit and scope of the Smart Candle Platform disclosed herein. Accordingly, the methods and embodiments pictured and described herein are for illustrative purposes only, and the scope of the present disclosure extends to all method and/or structures for providing increased functionality, comfort, longevity, enjoyment and aesthetics in the use and access of Smart Candle Platforms and aesthetic controllable natural lighting systems. Furthermore, the methods and embodiments pictured and described herein are no way limiting to the scope of the Smart Candle Platform and method of use unless so stated in the following claims.

It should be noted that the Smart Candle Platform is not limited to the specific embodiments pictured and described herein, but is intended to apply to all similar apparatuses and methods for providing the various benefits and/or features of a Smart Candle Platform. Modifications and alterations from the described embodiments will occur to those skilled in the art without departure from the spirit and scope of the Smart Candle Platform. It is understood that the Smart Candle Platform as disclosed herein extends to all alternative combinations of one or more of the individual features mentioned, evident from the text and/or drawings, and/or inherently disclosed. All of these different combinations constitute various alternative aspects of the Smart Candle Platform and/or components thereof. The embodiments described herein explain the best modes known for practicing the Smart Candle Platform and/or components thereof and will enable others skilled in the art to utilize the same. The claims are to be construed to include alternative embodiments to the extent permitted by the prior art.

While the Smart Candle Platform has been described in connection with preferred embodiments and specific examples, it is not intended that the scope be limited to the particular embodiments set forth, as the embodiments herein are intended in all respects to be illustrative rather than restrictive.

Unless otherwise expressly stated, it is in no way intended that any method set forth herein be construed as requiring that its steps be performed in a specific order. Accordingly, where a method claim does not actually recite an order to be followed by its steps or it is not otherwise specifically stated in the claims or descriptions that the steps are to be limited to a specific order, it is no way intended that an order be inferred, in any respect. This holds for any possible non-express basis for interpretation, including but not limited to: matters of logic with respect to arrangement of steps or operational flow; plain meaning derived from grammatical organization or punctuation; the number or type of embodiments described in the specification. It will be apparent to those skilled in the art that various modifications and variations can be made without departing from the scope or spirit. Other embodiments will be apparent to those skilled in the art from consideration of the specification and practice disclosed herein. It is intended that the specification and examples be considered as illustrative only, with a true scope and spirit being indicated by the following claims.

What is claimed is:

1. A living flame candle platform formed to emulate a traditional pillar candle in appearance comprising:
    a) an outer shell having a hollow interior connecting an upper end and a lower end and forming a first opening therein;
    b) an inner cover having a hollow interior connecting an upper end and an open lower end wherein the upper end has an annular opening therein, wherein the inner cover is positioned within the hollow interior of the outer shell;
    c) a top cover configured with an aperture, the top cover positioned in the interior of the outer shell upper end, wherein the top cover aperture and the inner cover annular opening are aligned to form an annular opening from the top cover aperture to the bottom of the inner cover;
    d) a fuel source configured as a cartridge and positioned in the annular opening of the inner cover;
    e) a base adapted for cooperative engagement with the lower end of the outer shell and the lower end of the inner cover and upon which the fuel source may rest, the base adapted to enclose the fuel source;
    f) an ignitor positioned proximate to a wick, and
    g) a continuity sensor adapted to sense a position of the fuel source.

2. The living flame candle platform formed to emulate a traditional pillar candle in appearance according to claim 1 wherein the fuel source configured as a cartridge is a candle delivery assembly.

3. The living flame candle platform formed to emulate a traditional pillar candle in appearance according to claim 2 wherein the candle delivery assembly configured as a cartridge further comprises:
   a) a feeder tube having an upper end with an aperture formed therein and a lower end formed as an annular opening;
   b) a solid wax candle having a top end and a bottom end with the wick partially embedded therein, the solid wax candle positioned in the annular opening of the feeder tube with the exposed wick of the solid wax candle positioned at the top end of the solid wax candle and within the aperture of the feeder tube proximate the top cover aperture;
   c) a spring having an upper end and a lower end, the spring interiorly positioned within the lower end of the feeder tube with the upper end against the lower end of the solid wax candle; and,
   d) a candle pusher having an upper portion and a lower portion; wherein the upper portion of the candle pusher is positioned against the lower end of the spring and the lower portion of the candle pusher rests against the base to drive the solid wax candle forward as the lit wick uses the wax during operation.

4. The living flame candle platform formed to emulate a traditional pillar candle in appearance according to claim 2 wherein a scent ring is positioned proximate the top cover aperture and wherein the heat of the living flame activates distribution of the scent.

5. The living flame candle platform formed to emulate a traditional pillar candle in appearance according to claim 1 wherein the fuel source is configured as a removable cartridge for providing fuel to the wick positioned partially within the removable cartridge therein, wherein the fuel is selected from one of a solid paraffin wax, a liquid paraffin, a soy, a veggie, a fatty acid, an essential oil or a combination thereof.

6. The living flame candle platform formed to emulate a traditional pillar candle in appearance according to claim 1 wherein a scent ring is positioned proximate the top cover aperture.

7. The living flame candle platform formed to emulate a traditional pillar candle in appearance according to claim 1 wherein a mid-frame is positioned in the interior of the inner cover, said mid-frame extending from the base to the top cover.

8. The living flame candle platform formed to emulate a traditional pillar candle in appearance according to claim 1 wherein a wax overflow trough is positioned proximate the top cover aperture.

9. The living flame candle platform formed to emulate a traditional pillar candle in appearance according to claim 1 wherein the ignitor is coupled with an ignitor system which is electronically controlled.

10. The living flame candle platform formed to emulate a traditional pillar candle in appearance according to claim 1 wherein at least one additional sensor is positioned proximate the wick, the at least one additional sensor is coupled to a control system which is electronically controlled.

11. The living flame candle platform formed to emulate a traditional pillar candle in appearance according to claim 10 wherein the at least one additional sensor comprises an accelerometer, a gyroscope, a magnetic based proximity sensor, a visual based proximity sensor, a fuel level sensor, a flame sensor, infra-red sensor, or a Thermopile sensor.

12. The living flame candle platform formed to emulate a traditional pillar candle in appearance according to claim 1 including at least one control system, the at least one control system including one or more of an on/off switch, an ignition control system, an extinguisher system, an infrared (IR) remote control system, a timer, a fuel control system, a fuel feed control system, or a fuel storage control system.

13. The living flame candle platform formed to emulate a traditional pillar candle in appearance according to claim 1 wherein at least one communication system is electronically coupled to the continuity sensor, wherein the at least one communication system includes one of a WiFi, a Bluetooth, a cellular or an audio type systems and wherein the at least one communication system allows communication between groups of living flame candle platforms thereby allowing multi-device and zone type control via the at least one communication system.

14. The living flame candle platform formed to emulate a traditional pillar candle in appearance according to claim 1 wherein the continuity sensor is disposed:
   proximate to the base, or
   proximate to the ignitor.

15. A living flame candle platform formed to emulate a traditional pillar candle in appearance comprising:
   a) an outer shell having a hollow interior connecting an upper end and a lower end wherein a rim is positioned around the interior of the upper end to form a first opening;
   b) an inner cover having a hollow interior connecting an upper end and an open lower end wherein the upper end has an annular opening formed therein, wherein the inner cover is positioned within the first opening of the outer shell;
   c) a top cover configured with an aperture, the top cover positioned in the interior of the outer shell upper end under the rim, wherein the top cover aperture and the inner cover annular opening are aligned to form an annular opening from the top cover aperture to the bottom of the inner cover;
   d) a fuel source is positioned in the annular opening of the inner cover, the fuel source configured as a removable canister for providing fuel to a wick, wherein the fuel is one of a solid paraffin wax, a liquid paraffin, a soy, a veggie, a fatty acid, an essential oil or a combination thereof;
   e) a base adapted for cooperative engagement with the lower end of the outer shell, the lower end of the inner cover and upon which the lower end of the fuel source may rest to enclose the fuel source and the inner cover within the outer shell;
   f) an ignitor positioned proximate to the wick, and
   g) a continuity sensor adapted to sense a position of the fuel source.

16. The living flame candle platform formed to emulate a traditional pillar candle in appearance according to claim 15 wherein a scent ring is positioned proximate the top cover aperture.

17. The living flame candle platform formed to emulate a traditional pillar candle in appearance according to claim 15 wherein a scent ring is positioned proximate the top cover aperture wherein the heat of the living flame activates distribution of the scent.

18. The living flame candle platform formed to emulate a traditional pillar candle in appearance according to claim 15 wherein the ignitor is coupled with an ignitor system which is electronically controlled.

19. The living flame candle platform formed to emulate a traditional pillar candle in appearance according to claim 15 wherein at least one additional sensor is positioned proximate the wick, the at least one additional sensor is coupled to a control system which is electronically controlled.

20. The living flame candle platform formed to emulate a traditional pillar candle in appearance according to claim 15 wherein the continuity sensor is disposed:
   proximate to the base, or
   proximate to the ignitor.

* * * * *